(12) United States Patent
Kim et al.

(10) Patent No.: US 11,507,237 B2
(45) Date of Patent: Nov. 22, 2022

(54) DISPLAY DEVICE AND METHOD OF DRIVING THE SAME

(71) Applicant: Samsung Display Co., Ltd., Yongin-si (KR)

(72) Inventors: Soowon Kim, Cheonan-si (KR); Hyungchul Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/232,884

(22) Filed: Apr. 16, 2021

(65) Prior Publication Data

US 2022/0075481 A1    Mar. 10, 2022

(30) Foreign Application Priority Data

Sep. 9, 2020 (KR) .................. 10-2020-0115469

(51) Int. Cl.
```
G06F 3/044      (2006.01)
G06F 3/041      (2006.01)
H01L 27/32      (2006.01)
```

(52) U.S. Cl.
CPC ........ *G06F 3/0446* (2019.05); *G06F 3/04166* (2019.05); *G06F 2203/04102* (2013.01); *H01L 27/3244* (2013.01); *H01L 2251/5338* (2013.01)

(58) Field of Classification Search
CPC ............... G06F 3/0446; G06F 3/04166; G06F 2203/04102; G06F 2203/04112; H01L 27/3244; H01L 2251/5338
See application file for complete search history.

(56) References Cited

U.S. PATENT DOCUMENTS

| | | | |
|---|---|---|---|
| 8,530,986 B2 | 9/2013 | Yoshida | |
| 9,164,612 B2 | 10/2015 | Chae | |
| 2016/0239133 A1* | 8/2016 | Ko | G06F 3/0448 |
| 2016/0266691 A1* | 9/2016 | Jang | G06F 3/0446 |
| 2016/0364044 A1* | 12/2016 | Kim | G06F 3/0446 |
| 2016/0378224 A1* | 12/2016 | Kwon | H01L 51/5256 |
| | | | 345/174 |
| 2017/0278899 A1* | 9/2017 | Yang | G06F 3/0412 |
| 2017/0278900 A1* | 9/2017 | Yang | H01L 27/3272 |
| 2017/0280553 A1* | 9/2017 | Kim | G06F 3/0446 |
| 2017/0315645 A1* | 11/2017 | Park | H01L 27/323 |
| 2018/0120997 A1* | 5/2018 | Moon | G06F 3/0446 |
| 2018/0232070 A1 | 8/2018 | Katsurahira | |
| 2019/0187843 A1* | 6/2019 | Ye | G06F 3/041 |
| 2021/0132666 A1 | 5/2021 | Kim et al. | |

FOREIGN PATENT DOCUMENTS

| | | | |
|---|---|---|---|
| KR | 10-2015-0017270 A | | 2/2015 |
| KR | 20160020629 A | * | 2/2016 |
| KR | 10-2016-0101315 A | | 8/2016 |
| KR | 10-1872518 B1 | | 6/2018 |
| KR | 20200079976 A | * | 7/2020 |
| KR | 10-2021-0054091 | | 5/2021 |

* cited by examiner

*Primary Examiner* — Michael Pervan
(74) *Attorney, Agent, or Firm* — Lewis Roca Rothgerber Christie LLP

(57) ABSTRACT

A display device includes a display panel including non-folding areas arranged along a first direction and a folding area between the non-folding areas, a first electrode on the display panel and extending in the first direction, and a second electrode on the display panel, insulated from the first electrode, and extending in a second direction crossing the first direction. Openings overlapping the folding area are in the first electrode.

19 Claims, 23 Drawing Sheets

DISPLAY DEVICE AND METHOD OF DRIVING THE SAME

CROSS-REFERENCE TO RELATED APPLICATION

This application claims priority to and the benefit of Korean Patent Application No. 10-2020-0115469, filed on Sep. 9, 2020 in the Korean Intellectual Property Office (KIPO), the entire contents of which are hereby incorporated by reference.

BACKGROUND

1. Field

The present disclosure relates to a display device and a method of driving the display device.

2. Description of Related Art

Electronic devices that provide images to a user, such as a smart phone, a digital camera, a notebook computer, a navigation unit, and a smart television, include a display device to display the images. The display device generates the images and provides the images to the user through a display screen thereof.

In recent years, with the technological development for the display device, various types of display devices are being developed. For example, various flexible display devices, which are foldable, rollable, or capable of being transformed into a curved shape, are being developed. The flexible display devices are easy to carry and improve user convenience.

Among the flexible display devices, a foldable display device is folded about a folding axis. Accordingly, a technology to easily fold a folding area of the foldable display device may be desirable.

SUMMARY

Aspects of one or more embodiments of the present disclosure are directed towards a display device including an input sensing part that is capable of being more easily folded.

Aspects of one or more embodiments of the present disclosure are directed towards a method of driving the display device.

Embodiments of the present inventive concept provide a display device including a display panel including non-folding areas arranged along a first direction and a folding area between the non-folding areas, a first electrode on the display panel and extending in the first direction, and a second electrode on the display panel, insulated from the first electrode, and extending in a second direction crossing the first direction. Openings overlapping the folding area are in the first electrode.

The openings may extend in the second direction, the openings being arranged along the first direction and the second direction.

The openings may include first horizontal openings arranged along the second direction and second horizontal openings arranged along the second direction, the second horizontal openings being spaced from the first horizontal openings in the first direction.

The first horizontal openings may partially overlap the second horizontal openings in the first direction.

The first horizontal openings may be alternately arranged with the second horizontal openings.

The openings may extend in a third direction substantially perpendicular to a plane defined by the first and second directions, the openings being arranged along the first direction and the third direction.

The openings may include first vertical openings arranged along the third direction and second vertical openings arranged along the third direction, the second vertical openings being spaced from the first vertical openings in the first direction.

The first vertical openings may partially overlap the second vertical openings in the first direction.

The first vertical openings may be alternately arranged with the second vertical openings.

The display device may further include a driver configured to provide a first driving voltage to the first electrode. The first electrode may include a plurality of first electrodes. The second electrode may include a plurality of second electrodes. The driver may be configured to apply a second driving voltage having a voltage level higher than a voltage level of the first driving voltage to a touched first electrode from among the first electrodes when the folding area is touched.

The display device may further include a base substrate on the display panel and an adhesive layer under the base substrate. The first and second electrodes may be under the base substrate, the first and second electrodes being attached to the display panel by the adhesive layer.

The first electrode may include a first portion having the openings, the first portion overlapping the folding area in a plan view, and a plurality of second portions overlapping the non-folding areas in a plan view. The folding area and the first portion may be configured to be folded about a folding axis substantially parallel to the second direction.

A width of the first portion in the second direction may be less than a width of each of the second portions in the second direction.

The first electrode may include a first main electrode extending in the first direction and a plurality of first sub-electrodes extending in the first direction, a width of each of the first sub-electrodes in the second direction being less than a width of the first main electrode in the second direction. The first main electrode may be between the first sub-electrodes. The openings may be in the first main electrode and the first sub-electrodes.

The second electrode may include a second main electrode extending in the second direction and a plurality of second sub-electrodes extending in the second direction, a width of each of the second sub-electrodes being less in the first direction than a width of the second main electrode in the first direction. The second main electrode may be between the second sub-electrodes.

Embodiments of the present inventive concept provide a method of driving a display device. The method includes touching an input sensing part on a display panel including a folding area and the input sensing part including a plurality of first electrodes having openings overlapping the folding area, the first electrodes being configured to receive a first driving voltage and a plurality of second electrodes insulated from the first electrodes, the second electrodes crossing the first electrodes, sensing a position of the touch, applying a second driving voltage having a voltage level higher than the first driving voltage to a first electrode that is touched from among the first electrodes when the touch position is within the folding area, and sensing the touch on the folding area.

The first electrodes may extend in a first direction. The second electrodes may extend in a second direction crossing the first direction. The folding area may be configured to be folded about a folding axis substantially parallel to the second direction. The openings may extend in the second direction and may be arranged along the first direction and the second direction.

The openings may include first horizontal openings arranged along the second direction and second horizontal openings arranged along the second direction, the second horizontal openings being spaced from the first horizontal openings in the first direction. The first horizontal openings may be alternately arranged with the second horizontal openings.

The openings may further extend in a third direction substantially perpendicular to a plane defined by the first and second directions, the openings being arranged along the first direction and the third direction, the openings including first vertical openings arranged along the third direction and second vertical openings arranged along the third direction, the second vertical openings being spaced from the first vertical openings in the first direction. The first vertical openings may be alternately arranged with the second vertical openings.

According to the above, the openings are defined through the electrode of the input sensing part that overlaps the folding area, and thus, the display device is more easily folded. In addition, when a user touches the electrode through which the opening are defined in the folding area, the driving voltage having a relatively higher voltage level is applied to the electrode through which the openings are defined, and thus, the sensing reliability is improved.

BRIEF DESCRIPTION OF THE DRAWINGS

The above and other aspects of the present disclosure will become readily apparent by reference to the following detailed description when considered in conjunction with the accompanying drawings wherein.

DETAILED DESCRIPTION

Figure 1:
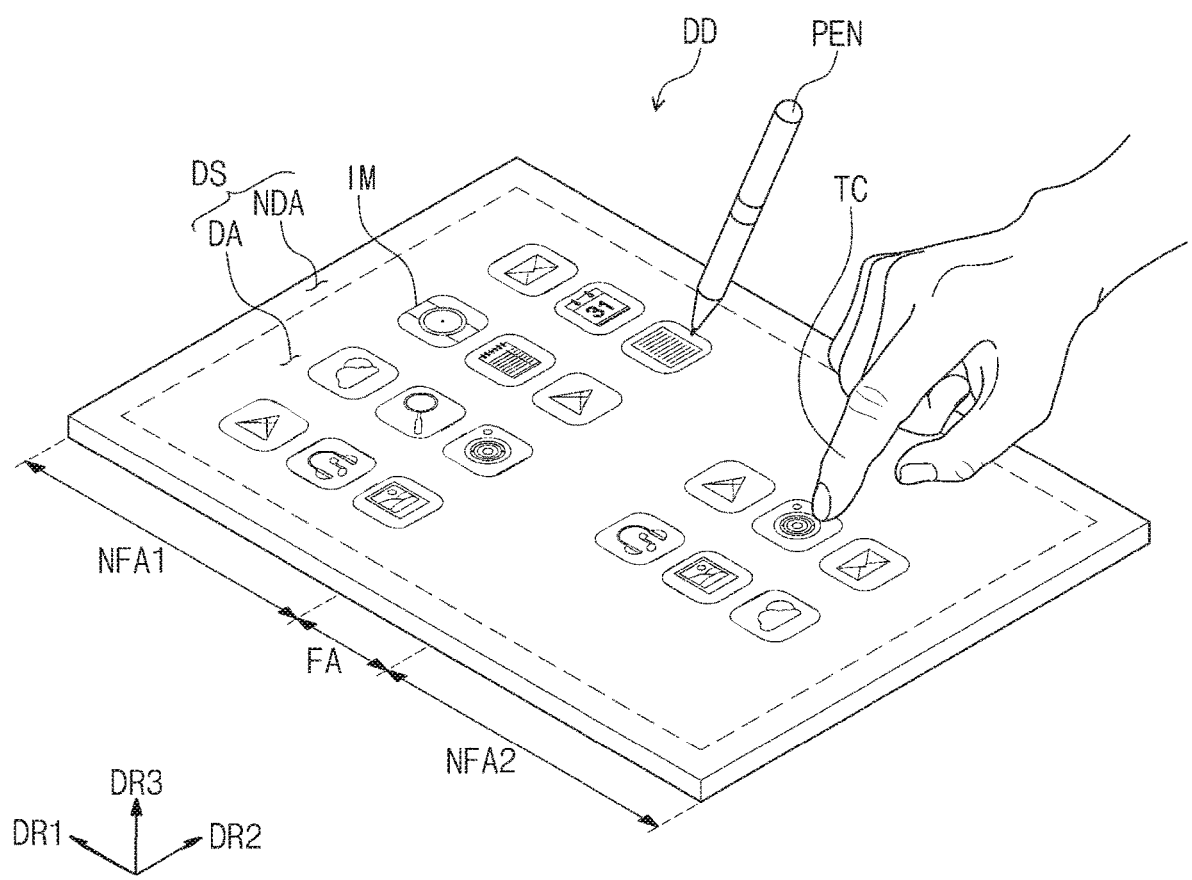
FIG. 1 is a perspective view showing a display device according to an embodiment of the present disclosure.

The present disclosure will now be described more fully with reference to the accompanying drawings in which example embodiments of the disclosure are shown. The terminology used herein is for the purpose of describing particular example embodiments only and is not intended to limit the example embodiments described herein.

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure. As used herein, the singular forms, "a", "an" and "the" are intended to include the plural forms as well, unless the context clearly indicates otherwise.

Further, the use of "may" when describing embodiments of the present disclosure refers to "one or more embodiments of the present disclosure".

Spatially relative terms, such as "beneath", "below", "lower", "above", "upper" and the like, may be used herein for ease of description to describe one element or feature's relationship to another element(s) or feature(s) as illustrated in the figures. will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially," "about," and similar terms are used as terms of approximation and not as terms of degree, and are intended to account for the inherent deviations in measured or calculated values that would be recognized by those of ordinary skill in the art.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, the present disclosure will be explained in more detail with reference to the accompanying drawings.

Figure 2:
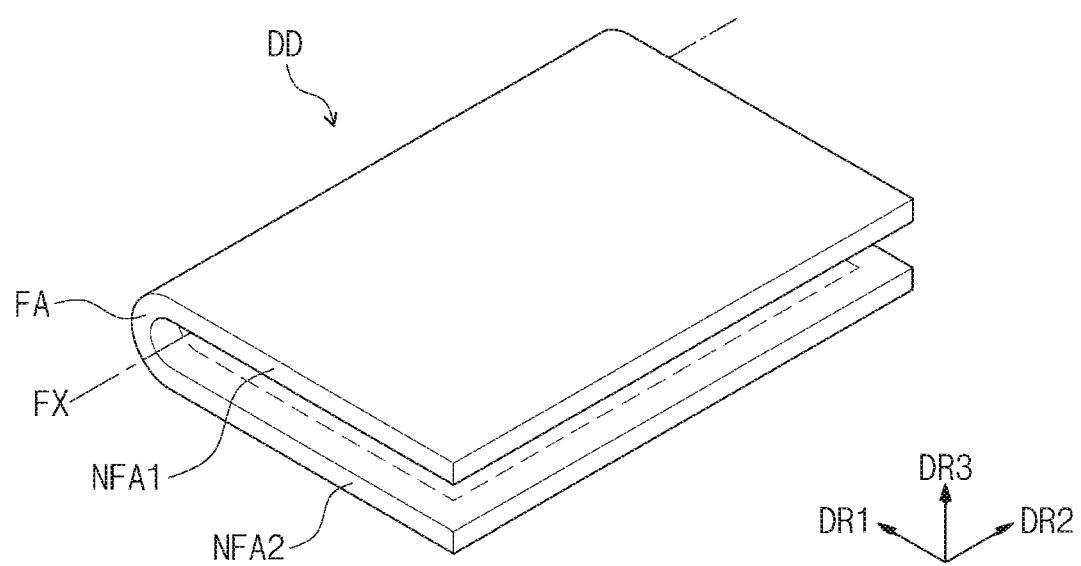
FIG. 2 is a perspective view showing a folded state of the display device shown in FIG. 1.

FIG. 1 is a perspective view showing a display device DD according to an embodiment of the present disclosure. FIG. 2 is a perspective view showing a folded state of the display device DD shown in FIG. 1.

Referring to FIG. 1, the display device DD according to the embodiment of the present disclosure may have a rectangular shape defined by long sides extending in a first direction DR1 and short sides extending in a second direction DR2 crossing the first direction DR1. However, the shape of the display device DD should not be limited to the rectangular shape, and the display device DD may have various suitable shapes, such as a circular shape and a polygonal shape. The display device DD may be a flexible display device.

Hereinafter, a direction substantially perpendicular to or normal to a plane (or to a surface on or parallel to the plane) defined by the first direction DR1 and the second direction DR2 may be referred to as a "third direction DR3". In the present disclosure, the expression "when viewed in a plan view" may refer to a state of being viewed in the third direction DR3.

The display device DD may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The second non-folding area NFA2, the folding area FA, and the first non-folding area NFA1 may be arranged in or along the first direction DR1.

In the present embodiment, one folding area FA and two non-folding areas NFA1 and NFA2 are shown as a representative example, however, the number of the folding areas FA and the number of non-folding areas NFA1 and NFA2 should not be limited thereto or thereby. For example, the display device DD may include more than two non-folding areas and a plurality of folding areas disposed between the non-folding areas (e.g., adjacent ones of the non-folding areas).

An upper surface of the display device DD may be referred to as a "display surface DS" and may be a plane surface defined by the first direction DR1 and the second direction DR2. Images IM generated by the display device DD may be provided to a user through the display surface DS (e.g., the display area DA of the display surface DS).

The display surface DS may include a display area DA and a non-display area NDA around the display area DA. The display area DA displays the image, and the non-display area NDA does not display the image. The non-display area NDA surrounds the display area DA and defines an edge (e.g., an outer edge) of the display device DD, which is printed by a set color (e.g., a predetermined color).

The display device DD may sense inputs applied thereto from the outside of the display device DD. For example, the display device DD may sense a first input generated by an input device PEN and/or a second input generated by a touch TC.

The input device PEN may be an active pen that outputs a signal. The second input generated by the touch TC may include various types of external inputs, such as a part of a user's body, light, heat, or pressure.

The display device DD and the input device PEN may communicate in both directions (e.g., may communicate with each other). The display device DD may provide an uplink signal to the input device PEN. For example, the uplink signal may include panel information and information on a protocol version. Although specific examples of uplink signal information is provided, the information included in the uplink signal is not limited thereto.

The input device PEN may provide a downlink signal to the display device DD. The downlink signal may include a synchronization signal or information on a state of the input device PEN. For example, the downlink signal may include coordinate information on the input device PEN, battery information on the input device PEN, a slope information on the input device PEN (e.g., the angle between the input device PEN and the display device DD), and/or various other information stored in or tracked by the input device PEN. Although specific examples of downlink signal information is provided, the information included in the downlink signal is not limited thereto.

Referring to FIG. 2, the display device DD may be, but not limited to, a foldable display device DD that is folded or unfolded. In other words, the display device DD may be, but not be limited to, a foldable display device. In this case, the folding area FA may be folded about a folding axis FX substantially parallel to the second direction DR2, and thus, the display device DD may be folded or unfolded (i.e., foldable). The folding axis FX may be defined as a minor axis substantially parallel to the short sides of the display device DD.

When the display device DD is folded, the first non-folding area NFA1 and the second non-folding area NFA2 face each other, and thus, the display device DD may be inwardly folded (in-folding) such that the display surface DS is not exposed to (e.g., does not face) the outside. In this case, the display surface DS may not be fully visible from the outside.

Figure 3:
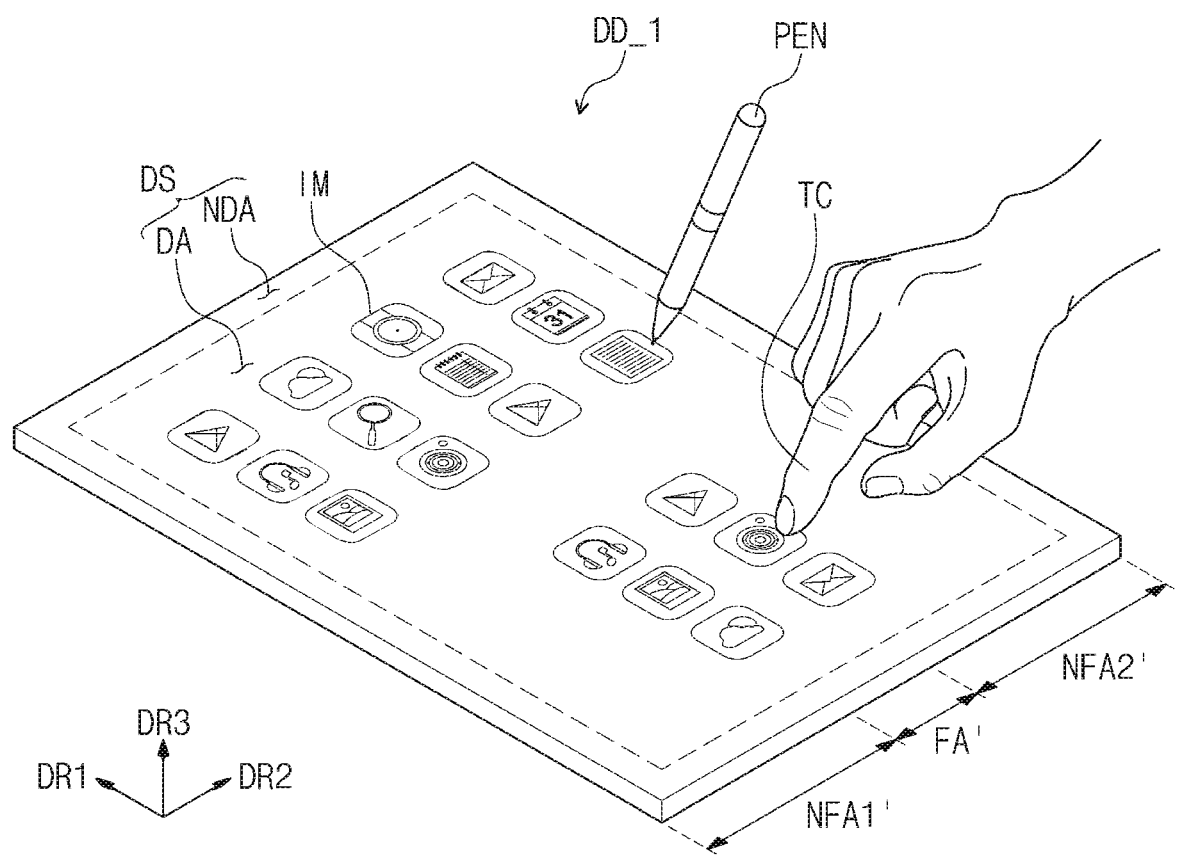
FIG. 3 is a perspective view showing a display device according to an embodiment of the present disclosure.
Figure 4:
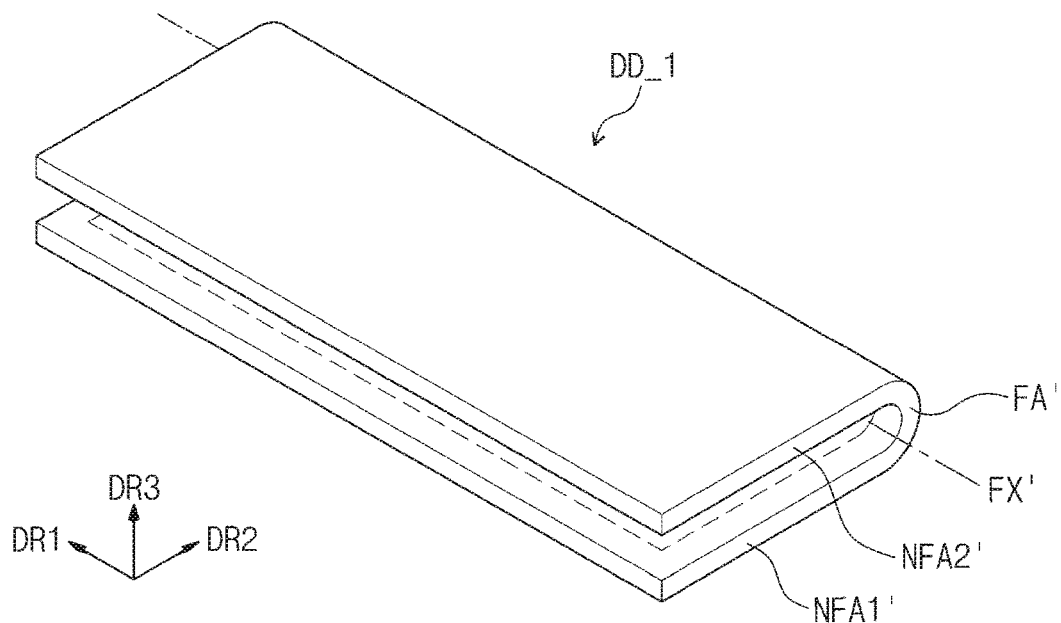
FIG. 4 is a perspective view showing a folded state of the display device shown in FIG. 3.

FIG. 3 is a perspective view showing a display device DD_1 according to an embodiment of the present disclosure. FIG. 4 is a perspective view showing a folded state of the display device DD_1 shown in FIG. 3.

The display device DD_1 shown in FIG. 3 may have the same configurations as those of the display device DD shown in FIG. 1 except for a folding operation. Accordingly, the folding operation of the display device DD_1 will be described in more detail below.

Referring to FIGS. 3 and 4, the display device DD_1 may include a folding area FA' and a plurality of non-folding areas NFA1' and NFA2'. The non-folding areas NFA1' and NFA2' may include a first non-folding area NFA1' and a second non-folding area NFA2'. The folding area FA' may be disposed between the first non-folding area NFA1' and the second non-folding area NFA2'. The first non-folding area NFA1', the folding area FA', and the second non-folding area NFA2' may be arranged in or along the second direction DR2.

In the present embodiment, one folding area FA' and two non-folding areas NFA1' and NFA2' are shown as a representative example, however, the number of the folding areas FA' and the number of non-folding areas NFA1' and NFA2' should not be limited thereto or thereby. For example, the display device DD may include more than two non-folding areas and a plurality of folding areas disposed between the non-folding areas (e.g., adjacent ones of the non-folding areas).

The folding area FA' is folded about a folding axis FX' substantially parallel to the first direction DR1, and thus, the display device DD_1 is folded. The folding axis FX' may be defined as a major axis substantially parallel to the long sides of the display device DD_1. The display device DD shown in FIG. 1 may be folded about the minor axis, and the display device DD_1 shown in FIG. 3 may be folded about the major axis. The display device DD_1 may be inwardly folded (i.e., in-folding) such that the display surface DS is not exposed to (e.g., does not face) the outside. In this case, the display surface DS may not be fully visible from the outside.

Figure 5:
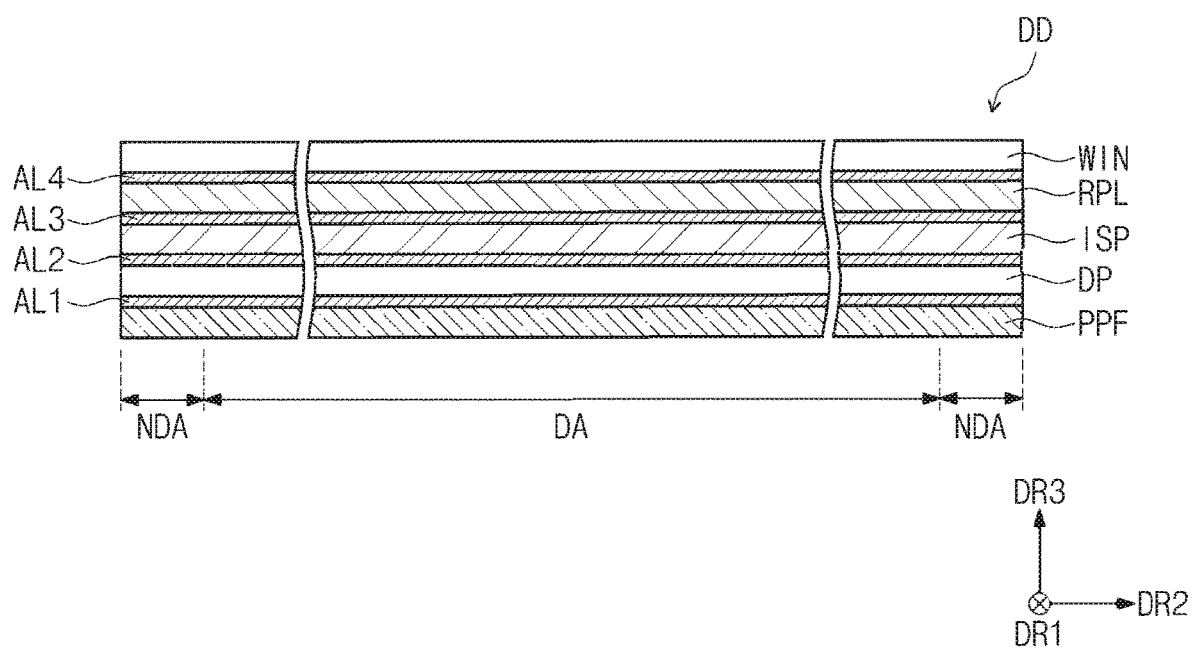
FIG. 5 is a cross-sectional view showing the display device shown in FIG. 1.

FIG. 5 is a cross-sectional view showing the display device DD shown in FIG. 1.

As an example, FIG. 5 shows a cross-section of the display device DD when viewed in the first direction DR1.

Referring to FIG. 5, the display device DD may include a display panel DP, an input sensing part ISP, an anti-reflective layer RPL, a window WIN, a panel protective film PPF, and first, second, third, and fourth adhesive layers AL1, AL2, AL3, and AL4.

The display panel DP may be a flexible display panel. The display panel DP may be a light-emitting type display panel. For instance, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described in more detail as a representative example of the display panel DP.

The input sensing part ISP may be disposed on the display panel DP. The input sensing part ISP may include a plurality of sensors to sense an external input by a capacitive method (e.g., a mutual capacitance method). The input sensing part ISP will be described in more detail below.

The anti-reflective layer RPL may be defined as an external light reflection preventing film. The anti-reflective layer RPL may reduce a reflectance of an external light incident on the display panel DP from above the display device DD (e.g., from outside the display device DD).

In a case where the external light incident to the display panel DP is provided to the user again after being reflected by the display panel (e.g., like a mirror), the user may perceive the external light. The anti-reflective layer RPL may include a plurality of color filters that displays the same colors as those of the pixels to prevent or substantially prevent the above-mentioned phenomenon.

The color filters may filter the external light to have the same color as the pixels. In this case, the external light may not be perceived by the user. However, the present disclosure should not be limited thereto or thereby, and the anti-reflective layer RPL may include a retarder and/or a polarizer to reduce the reflectance of the external light.

The window WIN may be disposed on the anti-reflective layer RPL. The window WIN may protect the display panel DP, the input sensing part ISP, and the anti-reflective layer RPL from external scratches and impacts.

The panel protective film PPF may be disposed under the display panel DP. The panel protective film PPF may protect a lower portion of the display panel DP. The panel protective film PPF may include a flexible plastic material such as polyethylene terephthalate (PET).

The first adhesive layer AL1 may be disposed between the display panel DP and the panel protective film PPF. The display panel DP and the panel protective film PPF may be coupled to each other by the first adhesive layer AL1.

The second adhesive layer AL2 may be disposed between the display panel DP and the input sensing part ISP. The display panel DP and the input sensing part ISP may be coupled to each other by the second adhesive layer AL2.

The third adhesive layer AL3 may be disposed between the anti-reflective layer RPL and the input sensing part ISP. The anti-reflective layer RPL and the input sensing part ISP may be coupled to each other by the third adhesive layer AL3.

The fourth adhesive layer AL4 may be disposed between the window WIN and the anti-reflective layer RPL. The window WIN and the anti-reflective layer RPL may be coupled to each other by the fourth adhesive layer AL4.

Figure 6:
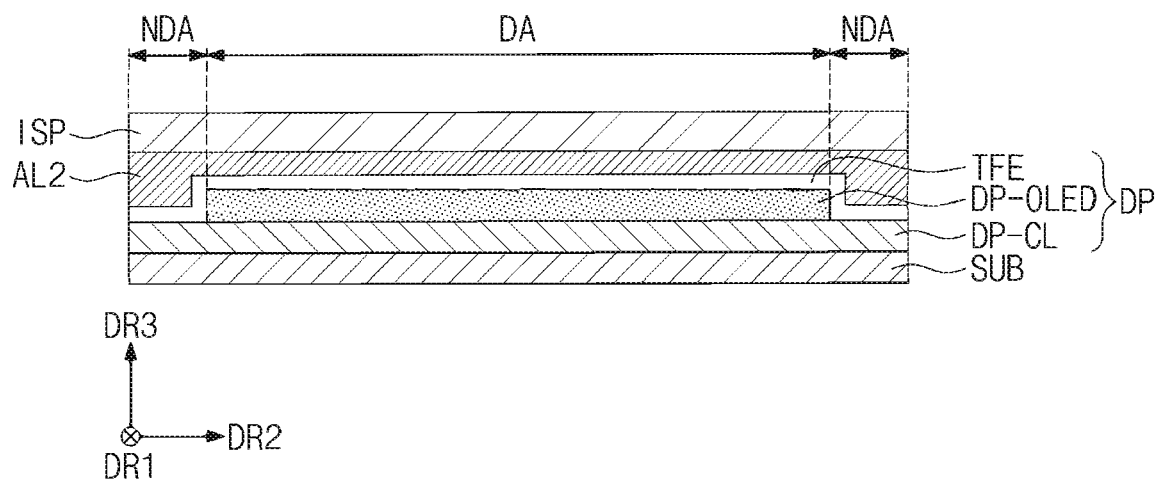
FIG. 6 is a cross-sectional view showing a display panel and an input sensing part disposed on the display panel shown in FIG. 5.

FIG. 6 is a cross-sectional view showing the display panel DP and the input sensing part ISP disposed on the display panel DP shown in FIG. 5.

As an example, FIG. 6 shows a cross-section of the display device DP when viewed in the first direction DR1.

Referring to FIG. 6, the display panel DP may include a substrate SUB, a circuit element layer DP-CL disposed on the substrate SUB, a display element layer DP-OLED disposed on the circuit element layer DP-CL, and a thin film encapsulation layer TFE disposed on the display element layer DP-OLED.

The substrate SUB may include a display area DA and a non-display area NDA around the display area DA. The substrate SUB may include a flexible plastic material such as polyimide (PI). The display element layer DP-OLED may be disposed in the display area DA. In one or more embodiments, the thin film encapsulation layer TFE may be disposed on the display element layer DP-OLED in the display area DA and on the circuit element layer DP-CL in the non-display area NDA.

A plurality of pixels may be disposed in the circuit element layer DP-CL and the display element layer DP-OLED. Each pixel may include a transistor disposed on the circuit element layer DP-CL and a light emitting element disposed on the display element layer DP-OLED and connected to the transistor. The pixel will be described in more detail below.

The thin film encapsulation layer TFE may be disposed on the circuit element layer DP-CL to cover the display element layer DP-OLED. The thin film encapsulation layer TFE may include inorganic layers and organic layers disposed between the inorganic layers. The inorganic layers may protect the pixels from moisture and oxygen. The organic layers may protect the pixels from a foreign substance such as dust particles.

The input sensing part ISP may be disposed on the thin film encapsulation layer TFE. The second adhesive layer AL2 may be disposed between the input sensing part ISP and the thin film encapsulation layer TFE. The input sensing part ISP may be attached to the thin film encapsulation layer TFE by the second adhesive layer AL2.

Figure 7:
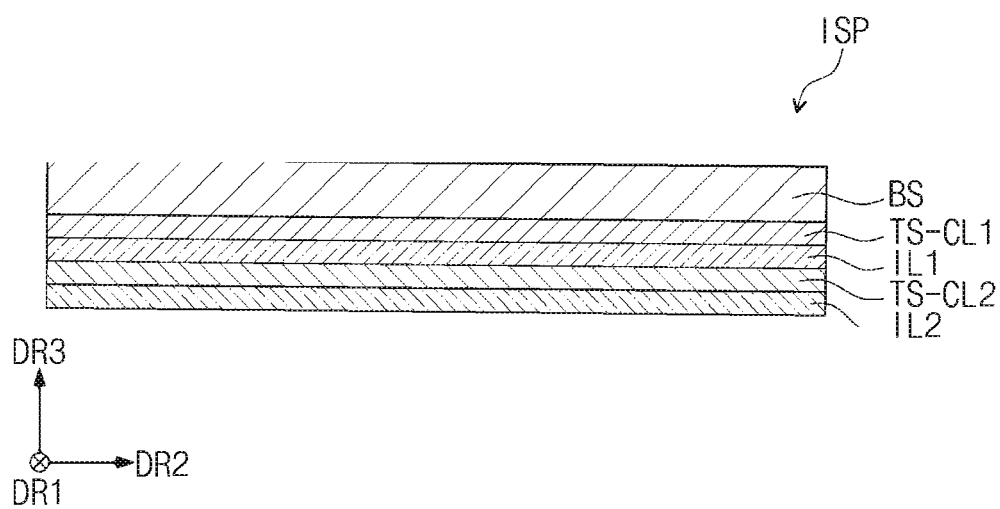
FIG. 7 is a cross-sectional view showing the input sensing part shown in FIG. 6.

FIG. 7 is a cross-sectional view showing the input sensing part ISP shown in FIG. 6.

Referring to FIG. 7, the input sensing part ISP may include a base substrate BS, a first conductive layer TS-CL1, a second conductive layer TS-CL2, a first insulating layer IL1, and a second insulating layer IL2. The base substrate BS may include a flexible plastic material such as polyethylene terephthalate (PET).

The first conductive layer TS-CL1 may be disposed under the base substrate BS. The first insulating layer IL1 may be disposed under the first conductive layer TS-CL1, and the second conductive layer TS-CL2 may be disposed under the first insulating layer IL1. The second insulating layer IL2 may be disposed under the second conductive layer TS-CL2. In one or more embodiments, the first conductive layer TS-CL1 may be between the base substrate BS and the first insulating layer IL1, and the second conductive layer TS-CL2 may be between the first insulating layer IL1 and the second insulating layer IL2.

The first conductive layer TS-CL1 and the second conductive layer TS-CL2 may include a conductive material. The first conductive layer TS-CL1 and the second conductive layer TS-CL2 may include a transparent conductive material, such as indium tin oxide (ITO). However, the first conductive layer TS-CL1 and the second conductive layer TS-CL2 may include any suitable conductive material, and therefore, the first conductive layer TS-CL1 and the second conductive layer TS-CL2 are not limited to including ITO.

The first insulating layer IL1 and the second insulating layer IL2 may include an organic or inorganic insulating layer.

Figure 8:
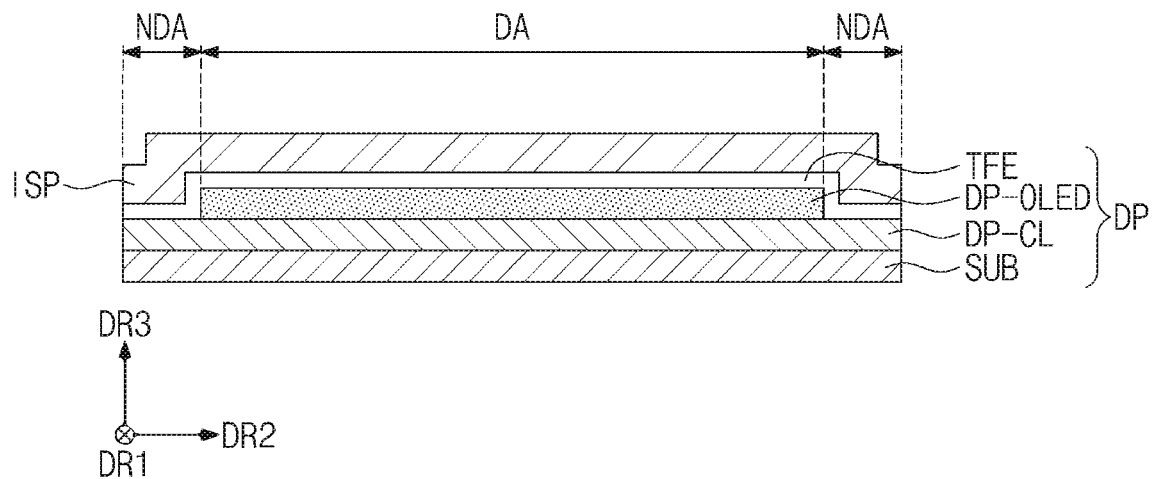
FIGS. 8 and 9 are cross-sectional views showing display panels and input sensing parts disposed on the display panels according to embodiments of the present disclosure.
Figure 9:
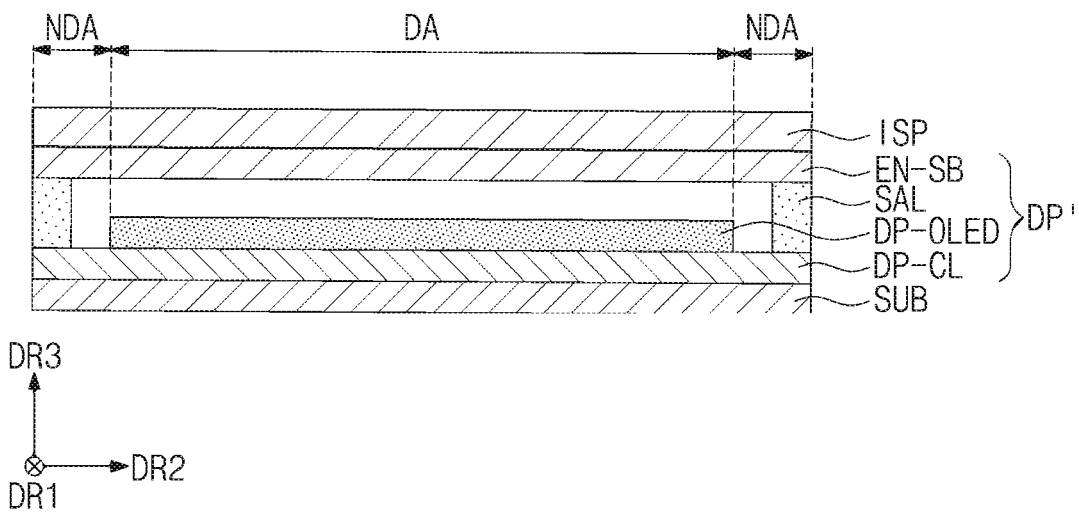

FIGS. 8 and 9 are cross-sectional views showing display panels DP and DP' and input sensing parts ISP disposed on the display panels DP and DP' according to embodiments of the present disclosure.

Hereinafter, in FIGS. 8 and 9, the display panels DP and DP' and the input sensing part ISP will be described in more detail including different components from those shown in the embodiment of FIG. 6.

Referring to FIG. 8, different from the structure shown in FIG. 6, the input sensing part ISP may be disposed directly on the display panel DP. For example, the input sensing part ISP may be disposed directly on a thin film encapsulation layer TFE. The input sensing part ISP may be manufactured directly on the display panel DP when the display device DD is manufactured.

Referring to FIG. 9, an encapsulation substrate EN-SB may be disposed on a display element layer DP-OLED. A sealant SAL may be disposed between a substrate SUB and the encapsulation substrate EN-SB. The sealant SAL may be disposed in a non-display area NDA. The substrate SUB may be coupled to the encapsulation substrate EN-SB by the sealant SAL. The display element layer DP-OLED may be sealed between the substrate SUB and the encapsulation substrate EN-SB by the sealant SAL.

The input sensing part ISP may be disposed directly on the display panel DP'. For example, the input sensing part ISP may be disposed directly on the encapsulation substrate EN-SB.

Figure 10:
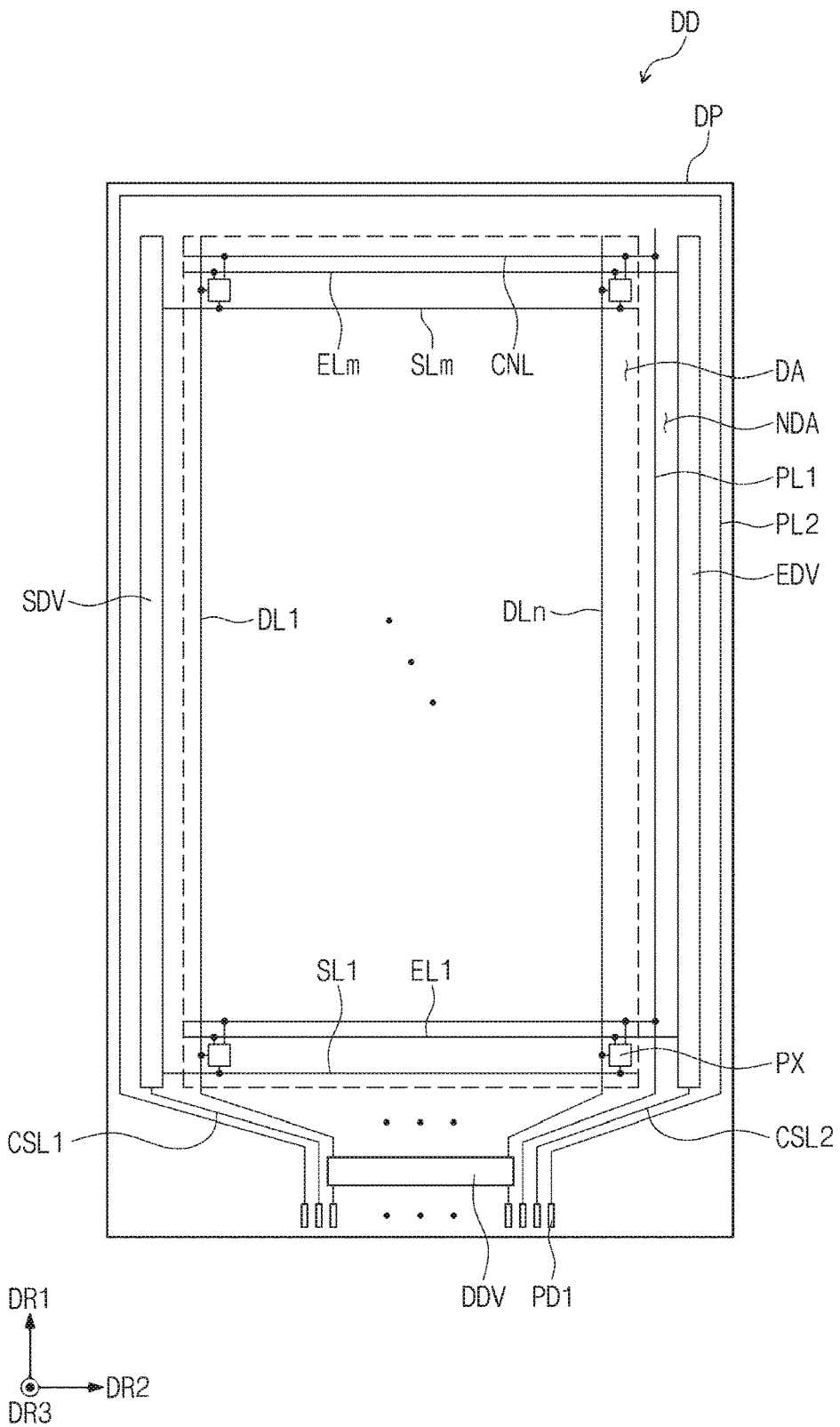
FIG. 10 is a plan view showing a display panel shown in FIG. 5.

FIG. 10 is a plan view showing the display panel DP shown in FIG. 5.

Referring to FIG. 10, the display device DD may include the display panel DP, a scan driver SDV, a data driver DDV, an emission driver EDV, and a plurality of first pads PD1.

The display panel DP may have a rectangular shape having long sides extending in the first direction DR1 and short sides extending in the second direction DR2, however, the shape of the display panel DP should not be limited thereto or thereby. The display panel DP may include the display area DA and the non-display area NDA surrounding the display area DA.

The display panel DP may include a plurality of pixels PX, a plurality of scan lines SL1 to SLm, a plurality of data lines DL1 to DLn, a plurality of emission lines EL1 to Elm, first and second control lines CSL1 and CSL2, first and second power lines PL1 and PL2, and connection lines CNL. As used herein, "m" and "n" each refer to a natural number.

The pixels PX may be arranged in or along the display area DA. The scan driver SDV and the emission driver EDV may be disposed in the non-display area NDA to be respectively adjacent to the long sides of the display panel DP. The data driver DDV may be disposed in the non-display area NDA to be adjacent to one short side of the short sides of the display panel DP. When viewed in a plane or in a plan view, the data driver DDV may be disposed to be adjacent to a lower end or lower side of the display panel DP.

The scan lines SL1 to SLm may extend in the second direction DR2 and may be connected to the pixels PX and the scan driver SDV. The data lines DL1 to DLn may extend in the first direction DR1 and may be connected to the pixels PX and the data driver DDV. The emission lines EL1 to ELm may extend in the second direction DR2 and may be connected to the pixels PX and the emission driver EDV.

The first power line PL1 may extend in the first direction DR1 and may be disposed in the non-display area NDA. The first power line PL1 may be disposed between the display area DA and the emission driver EDV, however, it should not be limited thereto or thereby. That is, the first power line PL1 may be disposed between the display area DA and the scan driver SDV.

The connection lines CNL may extend in the second direction DR2 and may be arranged in or along the first direction DR1. The connection lines CNL may be connected to the first power line PL1 and the pixels PX. A first voltage may be applied to the pixels PX through the first power line PL1 and the connection lines CNL connected to the first power line PL1.

The second power line PL2 may be disposed in the non-display area NDA. The second power line PL2 may extend along the long sides of the display panel DP and the short side (e.g., the other short side) at which the data driver DDV is not disposed in the display panel DP. The second power line PL2 may be disposed outside the scan driver SDV and the emission driver EDV. In one or more embodiments, the second power line PL2 may partially surround the scan driver SDV and the emission driver EDV.

In one or more embodiments, the second power line PL2 may extend to the display area DA and may be connected to the pixels PX. A second voltage having a level lower than that of the first voltage may be applied to the pixels PX through the second power line PL2.

The first control line CSL1 may be connected to the scan driver SDV and may extend toward the lower end of the display panel DP when viewed in a plane or in a plan view. The second control line CSL2 may be connected to the emission driver EDV and may extend toward the lower end of the display panel DP when viewed in a plane or in a plan view. The data driver DDV may be disposed between the first control line CSL1 and the second control line CSL2.

The first pads PD1 may be disposed on the display panel DP. The first pads PD1 may be disposed closer to the lower end of the display panel DP than the data driver DDV is to the lower end of the display panel DP. The data driver DDV, the first power line PL1, the second power line PL2, the first control line CSL1, and the second control line CSL2 may be connected to the first pads PD1. The data lines DL1 to DLn may be connected to the data driver DDV, and the data driver DDV may be connected to the first pads PD1 corresponding to the data lines DL1 to DLn.

In one or more embodiments, the display device DD may further include a timing controller to control an operation of the scan driver SDV, the data driver DDV, and the emission driver EDV and a voltage generator to generate the first and second voltages. The timing controller and the voltage generator may be connected to corresponding first pads PD1 through a printed circuit board.

The scan driver SDV may generate a plurality of scan signals, and the scan signals may be applied to the pixels PX through the scan lines SL1 to SLm. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive the data voltages in response to the scan signals. The pixels PX may emit a light having a luminance corresponding to the data voltages in response to the emission signals, and thus, the image may be displayed. An emission time of the pixels PX may be controlled by the emission signals.

Figure 11:
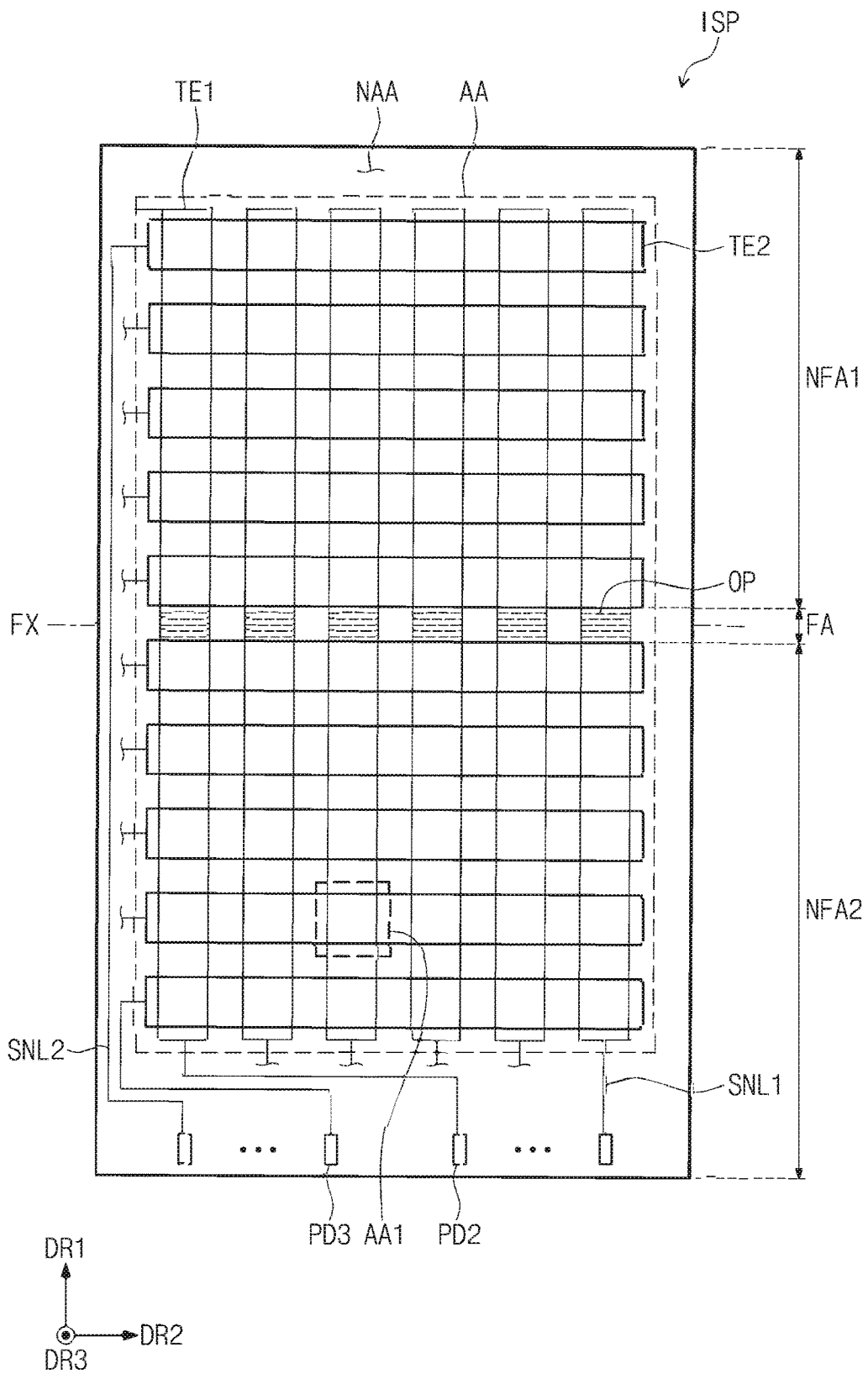
FIG. 11 is a plan view showing an input sensing part shown in FIG. 5.

FIG. 11 is a plan view showing the input sensing part ISP shown in FIG. 5.

Referring to FIG. 11, the input sensing part ISP may include a plurality of electrodes TE1 and TE2, a plurality of lines SNL1 and SNL2, and a plurality of second and third pads PD2 and PD3. The electrodes TE1 and TE2 may be defined as touch sensing electrodes.

A flat area of the input sensing part ISP may include an active area AA and a non-active area NAA around the active area AA. The active area AA may overlap the display area DA, and the non-active area NAA may overlap the non-display area NDA.

The electrodes TE1 and TE2 may be disposed in the active area AA, and the second and third pads PD2 and PD3 may be disposed in the non-active area NAA. The lines SNL1 and SNL2 may be connected to one ends of the electrodes TE1 and TE2 respectively and may extend to the non-active area NAA to be connected to the second and third pads PD2 and PD3 respectively.

When viewed in a plane or in a plan view, the second and third pads PD2 and PD3 may be disposed to be adjacent to a lower end of the input sensing part ISP. The second and third pads PD2 and PD3 may be connected to the above-mentioned printed circuit board. In one or more embodiments, a driver to drive the input sensing part ISP may be disposed on the printed circuit board and may be connected to the second and third pads PD2 and PD3.

In one or more embodiments, a plurality of first electrodes TE1 extending in the first direction DR1 and arranged in or along the second direction DR2 include first electrodes TE1 and a plurality of second electrodes TE2 extending in the second direction DR2 and arranged in or along the first direction DR1 include second electrodes TE2. The second electrodes TE2 may extend to be insulated from and to cross the first electrodes TE1. A capacitance may be formed by the first and second electrodes TE1 and TE2.

Openings OP may be defined through the first electrodes TE1 to overlap the folding area FA. The openings OP may not be defined in portions of the first electrodes TE1 overlapping the first and second non-folding areas NFA1 and NFA2. The openings OP will be described in more detail below.

In one or more embodiments, a plurality of first signal lines SNL1 connected to the first electrodes TE1 include first signal lines SNL1 and a plurality of second signal lines SNL2 connected to the second electrodes TE2 include second signal lines SNL2. As an example, the first signal lines SNL1 may be disposed in the non-active area NAA adjacent to the lower end of the input sensing part ISP and may be connected to the second pads PD2. As an example, the second signal lines SNL2 may be disposed in the non-active area NAA adjacent to a left portion of the input sensing part ISP and may be connected to the third pads PD3.

Figure 12:
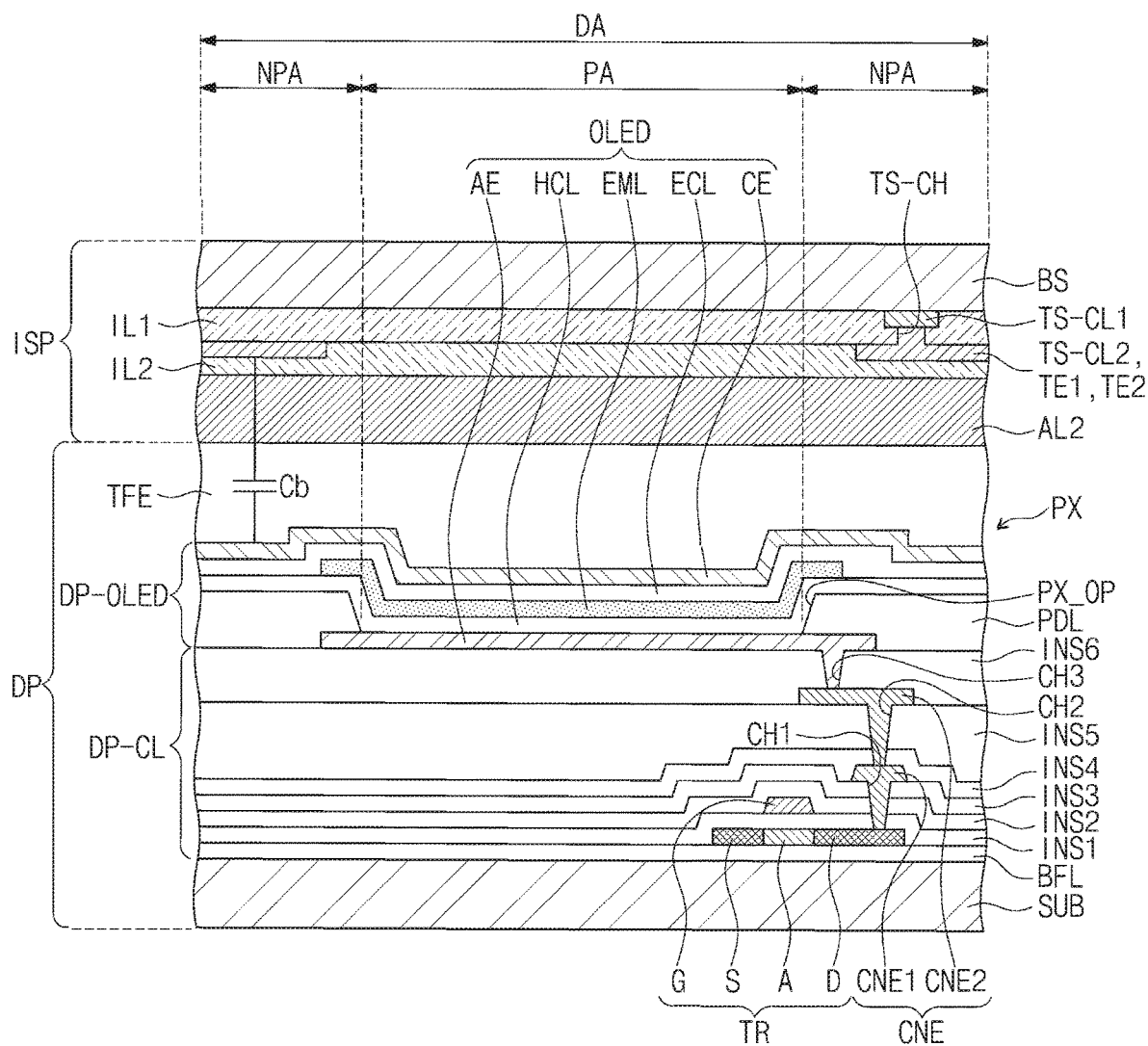
FIG. 12 is a cross-sectional view showing a pixel disposed in the display panel shown in FIG. 6 and the input sensing part disposed on the pixel.

FIG. 12 is a cross-sectional view showing a pixel disposed in the display panel shown in FIG. 6 and the input sensing part disposed on the pixel.

Referring to FIG. 12, the pixel PX may be disposed on the substrate SUB and may include the transistor TR and the light emitting element OLED. The light emitting element OLED may include a first electrode AE, a second electrode CE, a hole control layer HCL, an electron control layer ECL, and a light emitting layer EML. The first electrode AE may be an anode electrode, and the second electrode CE may be a cathode electrode.

The transistor TR and the light emitting element OLED may be disposed on the substrate SUB. As an example, one transistor TR is shown in FIG. 12, however, the pixel PX may include a plurality of transistors and at least one capacitor to drive the light emitting element OLED.

The display area DA may include a light emitting area PA corresponding to each pixel PX and a non-light-emitting area NPA around the light emitting area PA. The light emitting element OLED may be disposed in the light emitting area PA.

A buffer layer BFL may be disposed on the substrate SUB, and the buffer layer BFL may be an inorganic layer. A semiconductor pattern may be disposed on the buffer layer BFL. The semiconductor pattern may include a polycrystalline silicon, however, it should not be limited thereto or thereby. The semiconductor pattern may include amorphous silicon or metal oxide.

The semiconductor pattern may be doped with an N-type dopant or a P-type dopant. The semiconductor pattern may have different electrical properties depending on whether it is doped with the P-type dopant or the N-type dopant. The semiconductor pattern may include a high-doped region and a low-doped region. The high-doped region may have a conductivity greater than that of the low-doped region and may substantially serve as a source and a drain of the transistor TR. The low-doped region may substantially correspond to an active region (or a channel) of the transistor TR.

The source S, the active region A, and the drain D of the transistor TR may be formed from the semiconductor pattern. A first insulating layer INS1 may be disposed on the semiconductor pattern. A gate G of the transistor TR may be disposed on the first insulating layer INS1. A second insulating layer INS2 may be disposed on the gate G. A third insulating layer INS3 may be disposed on the second insulating layer INS2.

A connection electrode CNE may be disposed between (e.g., between in the thickness direction of the substrate SUB) the transistor TR and the light emitting element OLED to connect the transistor TR to the light emitting element OLED. The connection electrode CNE may include a first connection electrode CNE1 and a second connection electrode CNE2.

The first connection electrode CNE1 may be disposed on the third insulating layer INS3 and may be connected to the drain D through a first contact hole CH1 defined through the first, second, and third insulating layers INS1, INS2, and INS3. A fourth insulating layer INS4 may be disposed on the first connection electrode CNE1. A fifth insulating layer INS5 may be disposed on the fourth insulating layer INS4.

The second connection electrode CNE2 may be disposed on the fifth insulating layer INS5 and may be connected to the first connection electrode CNE1 through a second contact hole CH2 defined through the fifth insulating layer INS5. A sixth insulating layer INS6 may be disposed on the second connection electrode CNE2. Each of the first to sixth insulating layers (i.e., the first insulating layer INS1, the second insulating layer INS2, the third insulating layer INS3, the fourth insulating layer INS4, the fifth insulating layer INS5, the sixth insulating layer INS6) may be an inorganic layer or an organic layer.

The first electrode AE may be disposed on the sixth insulating layer INS6. The first electrode AE may be connected to the second connection electrode CNE2 through a third contact hole CH3 defined through the sixth insulating layer INS6. A pixel definition layer PDL may be disposed on the first electrode AE and the sixth insulating layer INS6 to expose a set portion (e.g., a predetermined portion) of the first electrode AE. The pixel definition layer PDL may be provided with an opening PX_OP defined therethrough to expose the portion of the first electrode AE.

The hole control layer HCL may be disposed on the first electrode AE and the pixel definition layer PDL. The hole control layer HCL may be disposed (e.g., commonly disposed) in the light emitting area PA and the non-light-emitting area NPA. The hole control layer HCL may include a hole transport layer and a hole injection layer.

The light emitting layer EML may be disposed on the hole control layer HCL. The light emitting layer EML may be disposed in an area corresponding to the opening PX_OP. The light emitting layer EML may include an organic material and/or an inorganic material. The light emitting layer EML may generate a light having one of a red color, a green color, and a blue color.

The electron control layer ECL may be disposed on the light emitting layer EML and the hole control layer HCL. The electron control layer ECL may be disposed (e.g., commonly disposed) in the light emitting area PA and the non-light-emitting area NPA. The electron control layer ECL may include an electron transport layer and an electron injection layer.

The second electrode CE may be disposed on the electron control layer ECL. The second electrode CE may be disposed (e.g., commonly disposed) in the pixels PX. Layers from the buffer layer BFL to the sixth insulating layer INS6 may be referred to as the circuit element layer DP-CL. A layer on which the light emitting element OLED is disposed may be referred to as the display element layer DP-OLED.

The thin film encapsulation layer TFE may be disposed on the light emitting element OLED. The thin film encapsulation layer TFE may be disposed on the second electrode CE to cover the pixel PX.

The first voltage may be applied to the first electrode AE through the transistor TR, and the second voltage, which has a voltage level lower than that of the first voltage, may be applied to the second electrode CE. Holes and electrons injected into the light emitting layer EML may be recombined to generate excitons, and the light emitting element OLED may emit light by the excitons that return to a ground state from an excited state.

The first conductive layer TS-CL1 may be disposed under the base substrate BS, and the first insulating layer IL1 may be disposed under the base substrate BS to cover the first conductive layer TS-CL1. The first conductive layer TS-CL1 may be used to form a bridge pattern described in more detail below.

The second conductive layer TS-CL2 may be disposed under the first insulating layer IL1, and the second insulating layer IL2 may be disposed under the first insulating layer IL1 to cover the second conductive layer TS-CL2. In one or more embodiments, the second conductive layer TS-CL2 may be between the first insulating layer IL1 and the second insulating layer IL2. The second conductive layer TS-CL2 may be used to form the first and second electrodes TE1 and TE2.

The second conductive layer TS-CL2 may be connected to the first conductive layer TS-CL1 through a contact hole TS-CH defined through the first insulating layer IL1. Substantially, the patterns of the first electrode TE1 may be connected to the bridge pattern through the contact hole TS-CH, and this structure will be described in more detail with reference to FIG. 14.

The second adhesive layer AL2 may be disposed between the second insulating layer IL2 and the thin film encapsulation layer TFE. The first conductive layer TS-CL1 and the second conductive layer TS-CL2 may be attached to the display panel DP by the second adhesive layer AL2.

A parasitic capacitance Cb may be formed between the input sensing part ISP and the second electrode CE. When a distance between the input sensing part ISP and the second electrode CE decreases, the parasitic capacitance Cb may increase. As the parasitic capacitance Cb increases, a ratio of a variation in the capacitance formed in the input sensing part ISP to a reference value may decrease. The variation in the capacitance may refer to a difference in capacitance between a capacitance before an input by the input device (e.g., the active pen or the touch of the user shown in FIG. 1), and a capacitance after the input by the input device.

The driver that processes the signal sensed by the input sensing part ISP may perform a leveling operation to remove a value corresponding to the parasitic capacitance Cb from the sensed signal. The ratio of the variation in the capacitance to the reference value may increase by the leveling operation, and thus, a sensing sensitivity may be improved.

However, there may be a difference in ability to remove the value corresponding to the parasitic capacitance Cb depending on a specification of the driver. For example, when a maximum parasitic capacitance Cb is about 500 picofarads and a capacitance value able to be removed from the signal sensed by the input sensing part ISP by the driver is about 200 picofarads, the value corresponding to the parasitic capacitance Cb may not be sufficiently removed. In this case, the ratio of the variation in the capacitance to the reference value may be insignificant (e.g., not significant enough to distinguish a touch event from false positives), and thus, the driver may recognize the variation in the capacitance as a noise or may not recognize the variation in the capacitance. Accordingly, the driver may not sense the touch coordinate and may fail to function as desired (i.e., function normally).

In the embodiment of the present disclosure, the input sensing part ISP may be implemented to allow the maximum value of the parasitic capacitance Cb to be equal to or smaller (i.e., less) than a set value (e.g., a predetermined value). To this end, a size of the electrode of the input sensing part ISP and a distance between the input sensing part ISP and the second electrode CE may be adjusted. In this case, even though the driver's performance is relatively low, the accuracy of coordinate recognition may be improved. In the embodiment of the present disclosure, the maximum value of the parasitic capacitance Cb may be equal to or smaller (i.e., less) than about 200 picofarads, however, the maximum value of the parasitic capacitance Cb is not limited thereto.

Figure 13:
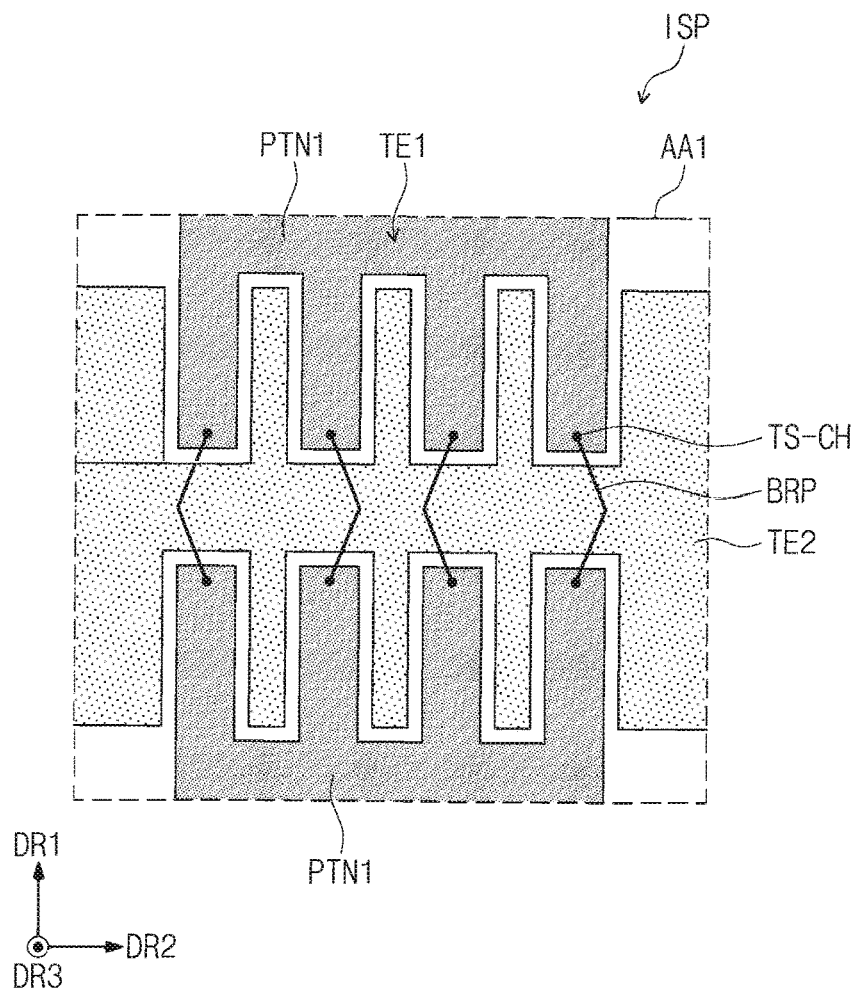
FIG. 13 is an enlarged view showing a first area shown in FIG. 11.
Figure 14:
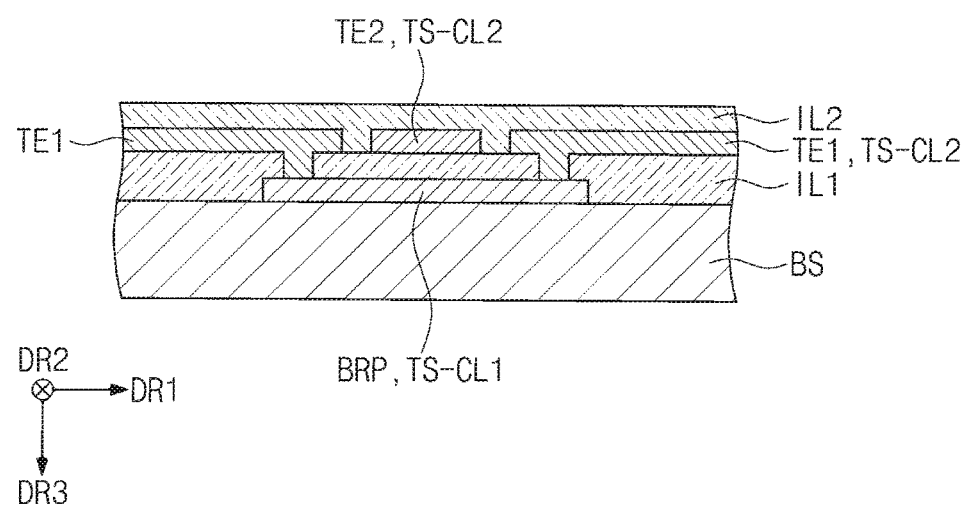
FIG. 14 is a cross-sectional view showing the input sensing part in which a bridge pattern shown in FIG. 13 is disposed.

FIG. 13 is an enlarged view showing a first area AA1 shown in FIG. 11, and FIG. 14 is a cross-sectional view showing the input sensing part ISP in which the bridge pattern BRP shown in FIG. 13 is disposed.

In FIG. 14, as an example, the base substrate BS is disposed under the first and second electrodes TE1 and TE2.

Referring to FIGS. 13 and 14, the bridge patterns BRP may be disposed on the base substrate BS. The bridge patterns BRP may be formed by the first conductive layer TS-CL1.

The first and second electrodes TE1 and TE2 may be disposed on the same layer as each other. For example, the first and second electrodes TE1 and TE2 may be disposed at the same layer as each other. The first and second electrodes TE1 and TE2 may be disposed on a layer different from a layer on which the bridge patterns BRP are disposed. For example, the first and second electrodes TE1 and TE2 may be disposed at a different layer from the bridge patterns BRP.

The first and second electrodes TE1 and TE2 may be disposed on the first insulating layer IL1. The first and second electrodes TE1 and TE2 may be formed by the second conductive layer TS-CL2.

The first electrode TE1 may include a plurality of first patterns PTN1 arranged in or along the first direction DR1. The second electrode TE2 may pass between the first patterns PTN1 and may extend in the second direction DR2.

The first patterns PTN1 may include protrusion patterns protruded in the first direction DR1, however, the shape of the first patterns PTN1 should not be limited thereto or thereby. The second electrode TE2 disposed between the first patterns PTN1 may include protrusion patterns protruded in the first direction DR1, however, the shape of the second electrode TE2 should not be limited thereto or thereby.

The first patterns PTN1 may be connected to the bridge patterns BRP. For example, the first patterns PTN1 may be connected to the bridge patterns BRP through the contact holes TS-CH defined through the first insulating layer IL1. The first patterns PTN1 may be connected (e.g., electrically connected) to each other by the bridge patterns BRP.

As an example, the bridge patterns BRP are disposed under the first and second electrodes TE1 and TE2, however, they should not be limited thereto or thereby. As another example, the bridge patterns BRP may be disposed above the first and second electrodes TE1 and TE2.

As an example, the bridge patterns BRP are used, however, the bridge patterns BRP may not be used (i.e., may be omitted). In this case, the first electrode TE1 and the second electrode TE2 may be disposed on different layers from each other, and the first electrode TE1 may be formed in a single body without being divided into the first patterns PTN1 (e.g., separate first patterns PTN1 as shown in FIG. 13) and may extend in the first direction DR1. For example, the first electrode TE1 and the second electrode TE2 may be at different layers from each other, and the first electrode TE1 may be formed in a single body without being divided into the first patterns PTN1 (e.g., separate first patterns PTN1 as shown in FIG. 13) and may extend in the first direction DR1.

Figure 15:
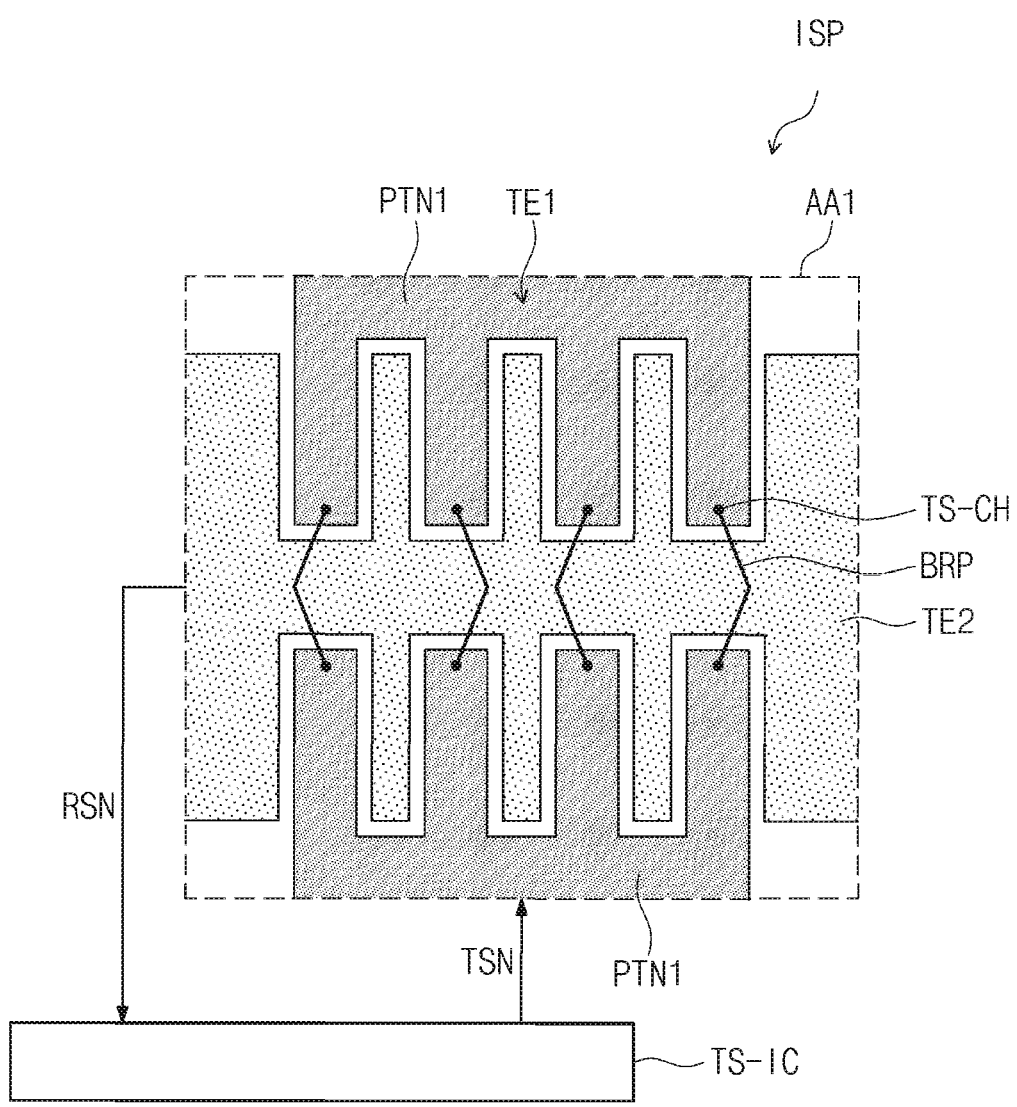
FIG. 15 is a view showing a first operation mode of the input sensing part shown in FIG. 11.
Figure 16:
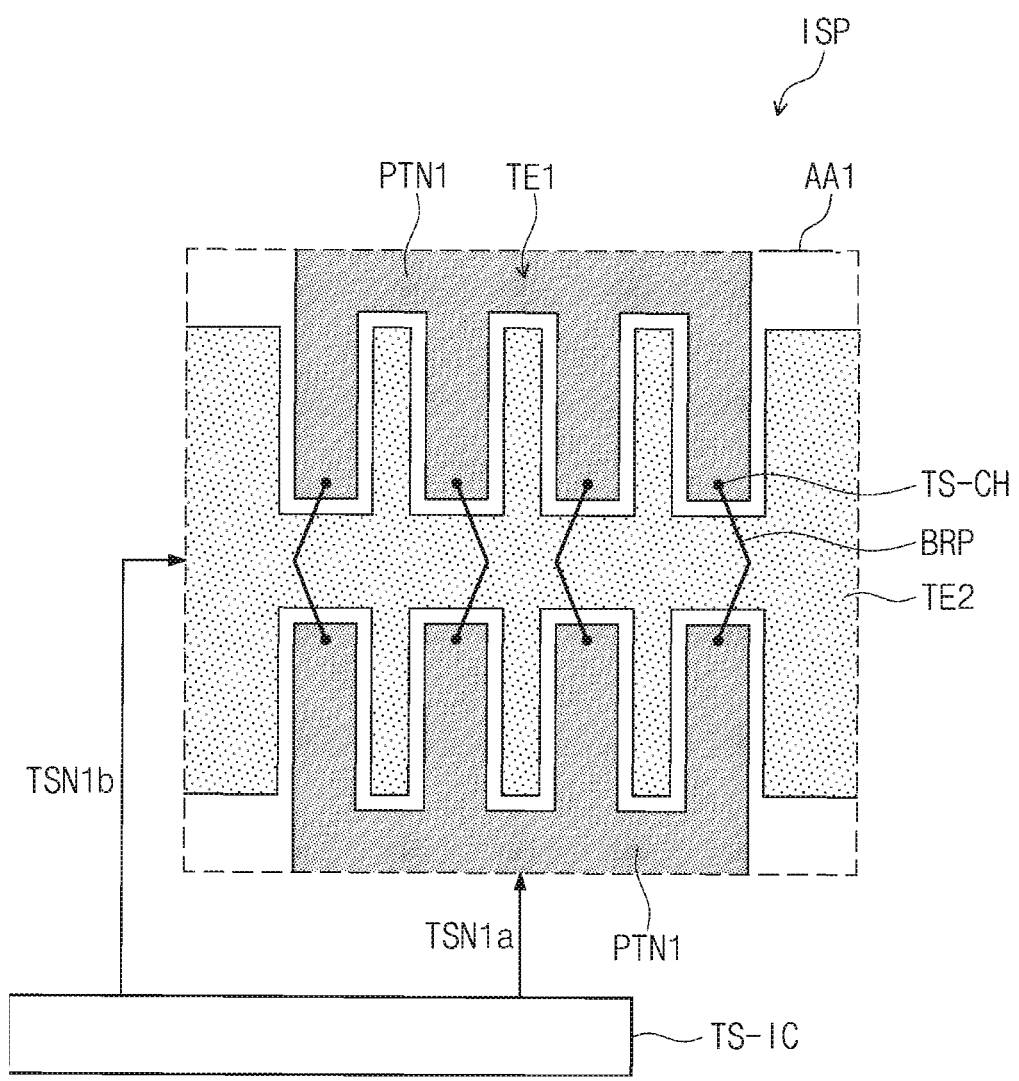
FIGS. 16 and 17 are views showing a second operation mode of the input sensing part shown in FIG. 11.
Figure 17:
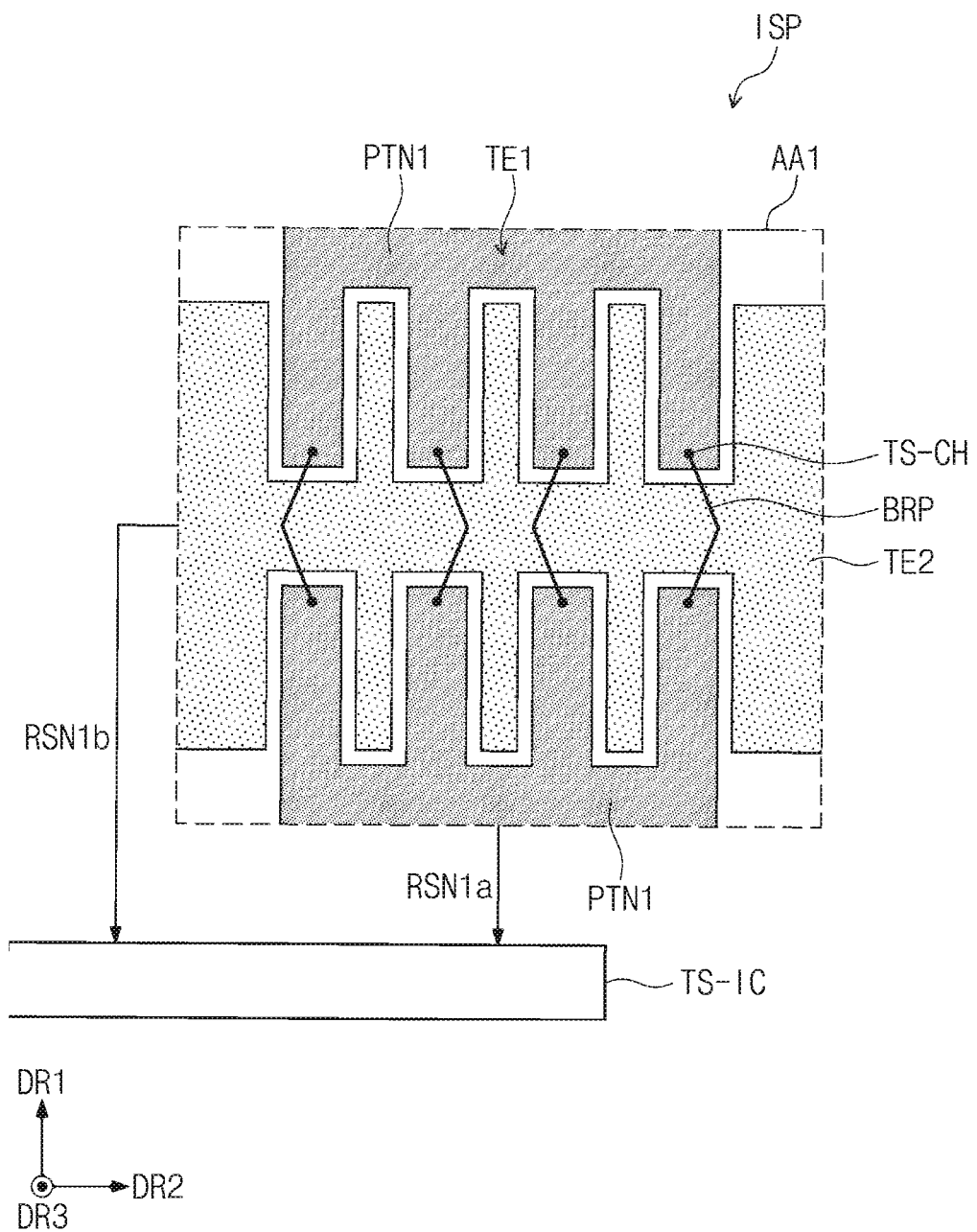

FIG. 15 is a view showing a first operation mode of the input sensing part ISP shown in FIG. 11, and FIGS. 16 and 17 are views showing a second operation mode of the input sensing part ISP shown in FIG. 11.

As an example, FIGS. 15-17 show a structure of the first and second electrodes TE1 and TE2 shown in FIG. 12 when viewed in a plane or in a plan view.

Referring to FIG. 15, the input sensing part ISP may operate in the first mode. In the first mode, the input sensing part ISP may sense the input generated by the touch TC. In the first mode, the driver TS-IC may sense a variation in a mutual capacitance formed between the first electrode TE1 and the second electrode TE2 to sense the external input. The driver TS-IC may be disposed on a printed circuit board and may be connected to the input sensing part ISP.

In the first mode, the driver TS-IC may provide a driving signal TSN to the first electrode TE1 and may receive a sensing signal RSN from the second electrode TE2. That is, in the first mode, the first electrode TE1 may serve as a transmitting electrode, and the second electrode TE2 may serve as a receiving electrode. However, they should not be limited thereto or thereby, the first electrode TE1 may serve as the receiving electrode, and the second electrode TE2 may serve as the transmitting electrode.

Referring to FIGS. 16 and 17, the input sensing part ISP may operate in the second mode. The second mode may be a mode in which the display device DD and the input device PEN transmit and receive data to and from each other. The operation shown in FIG. 16 may be an operation in which the display device DD provides a first signal to the input device PEN. The operation shown in FIG. 17 may be an operation in which the input device PEN provides a second signal to the display device DD.

Referring to FIG. 16, the first electrode TE1 and the second electrode TE2 may be used as transmitting electrodes, respectively, to provide first signals TSN1a and TSN1b provided from the driver TS-IC to the input device PEN. The first signals TSN1a and TSN1b may be uplink signals. As an example, both the first electrode TE1 and the second electrode TE2 are used as the transmitting electrode, however, they should not be limited thereto or thereby. As another example, one of the first electrode TE1 and the second electrode TE2 may be used as the transmitting electrode.

Referring to FIG. 17, the first electrode TE1 and the second electrode TE2 may be used as receiving electrodes, respectively, to transmit sensing signals RSN1a and RSN1b induced from the input device PEN to the driver TS-IC. The driver TS-IC may receive the sensing signals RSN1a and RSN1b from the first electrode TE1 and the second electrode TE2. The sensing signals RSN1a and RSN1b may be signals obtained by sensing downlink signals.

Figure 18:
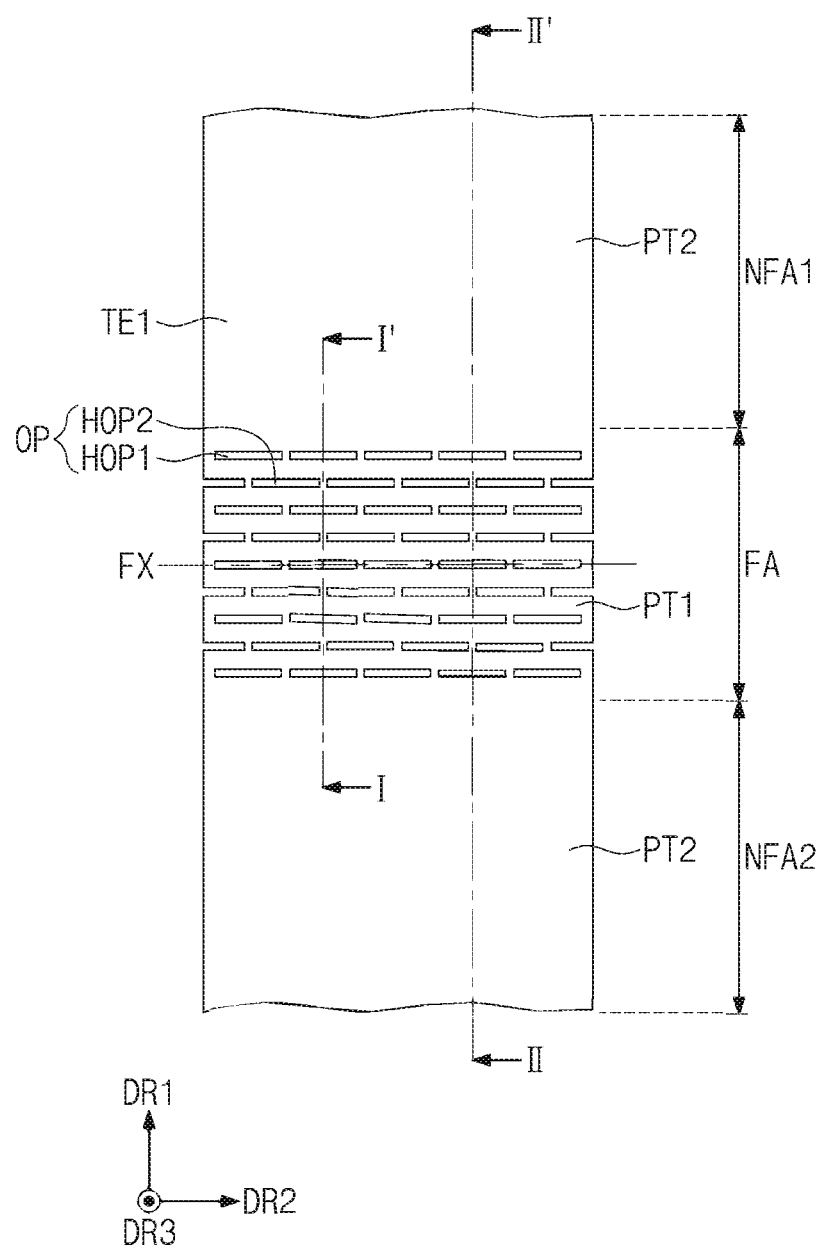
FIG. 18 is a partially enlarged view showing a portion of a first electrode through which openings are defined in FIG. 11.

FIG. 18 is a partially enlarged view showing a portion of the first electrode TE1 through which openings OP are defined in FIG. 11.

Referring to FIG. 18, the first electrode TE1 may include a first portion PT1 overlapping the folding area FA and a plurality of second portions PT2 overlapping the first and second non-folding areas NFA1 and NFA2.

The openings OP may be defined through the first portion PT1. The first portion PT1 may be folded about the folding axis FX. As the openings OP are defined through the first portion PT1, the first portion PT1 may be more easily folded about the folding axis FX.

The openings OP may be arranged in or along the first direction DR1 and the second direction DR2. The openings OP may extend in the second direction DR2. The openings OP may include first horizontal openings HOP1 arranged in or along the second direction DR2 and second horizontal openings HOP2 spaced from (e.g., spaced apart from) the first horizontal openings HOP1 in the first direction DR1 and arranged in or along the second direction DR2.

In one or more embodiments, the first horizontal openings HOP1 may be spaced from (e.g., spaced apart from) each other in or along the second direction DR2. The second horizontal openings HOP2 may be spaced from (e.g., spaced apart from) each other in or along the second direction DR2. The rows of first and second horizontal openings HOP1 and HOP2 may be alternately arranged with each other in or along the first direction DR1.

When viewed in the first direction DR1, the first horizontal openings HOP1 may partially overlap the second horizontal openings HOP2. The first horizontal openings HOP1 and the second horizontal openings HOP2 may be spaced from (e.g., spaced apart from) each other in the first direction DR1 and may be alternately arranged with each other in the first direction DR1. The first horizontal openings HOP1 may be consecutively arranged in or along the second direction DR2 and the second horizontal openings HOP2 may be consecutively arranged in or along the second direction DR2.

As the first and second horizontal openings HOP1 and HOP2 are defined through the first portion PT1, the first portion PT1 may be more easily folded about the folding axis FX.

Figure 19:
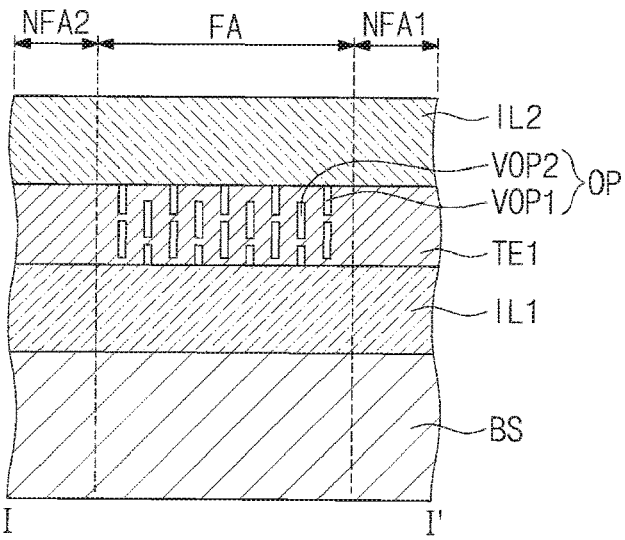
FIG. 19 is a cross-sectional view taken along the line I-I' shown in FIG. 18.
Figure 19:
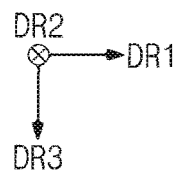

FIG. 19 is a cross-sectional view taken along the line I-I' shown in FIG. 18.

Referring to FIG. 19, the openings OP may be arranged in or along the first direction DR1 and the third direction DR3. The openings OP may extend in the third direction DR3. The openings OP may include first vertical openings VOP1 arranged in or along the third direction DR3 and second vertical openings VOP2 spaced from (e.g., spaced apart from) the first vertical openings VOP1 in the first direction DR1 and arranged in or along the third direction DR3.

When viewed in the first direction DR1, the first vertical openings VOP1 may partially overlap the second vertical openings VOP2. The first vertical openings VOP1 and the second vertical openings VOP2 may be spaced from (e.g., spaced apart from) each other in the first direction DR1 and may be alternately arranged with each other in the first direction DR1. The first vertical openings VOP1 may be consecutively arranged in or along the third direction DR3 and the second vertical openings VOP2 may be consecutively arranged in or along the third direction DR3.

As the first and second vertical openings VOP1 and VOP2 are defined through the first portion PT1, the first portion PT1 may be more easily folded about the folding axis FX.

Figure 20:
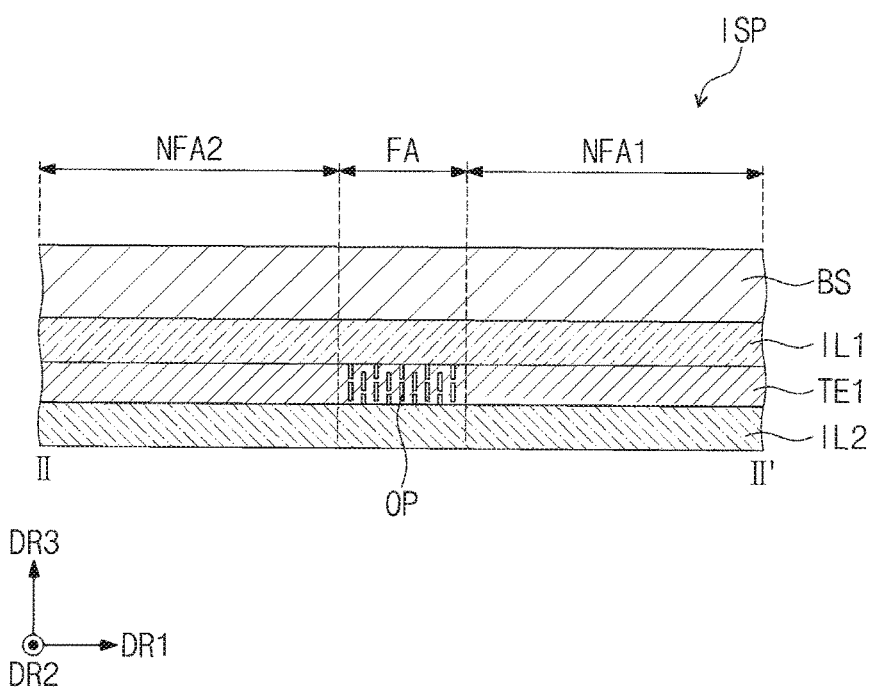
FIG. 20 is a cross-sectional view taken along the line II-II' shown in FIG. 18.
Figure 20:
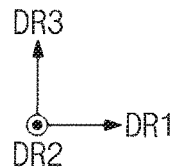
Figure 21:
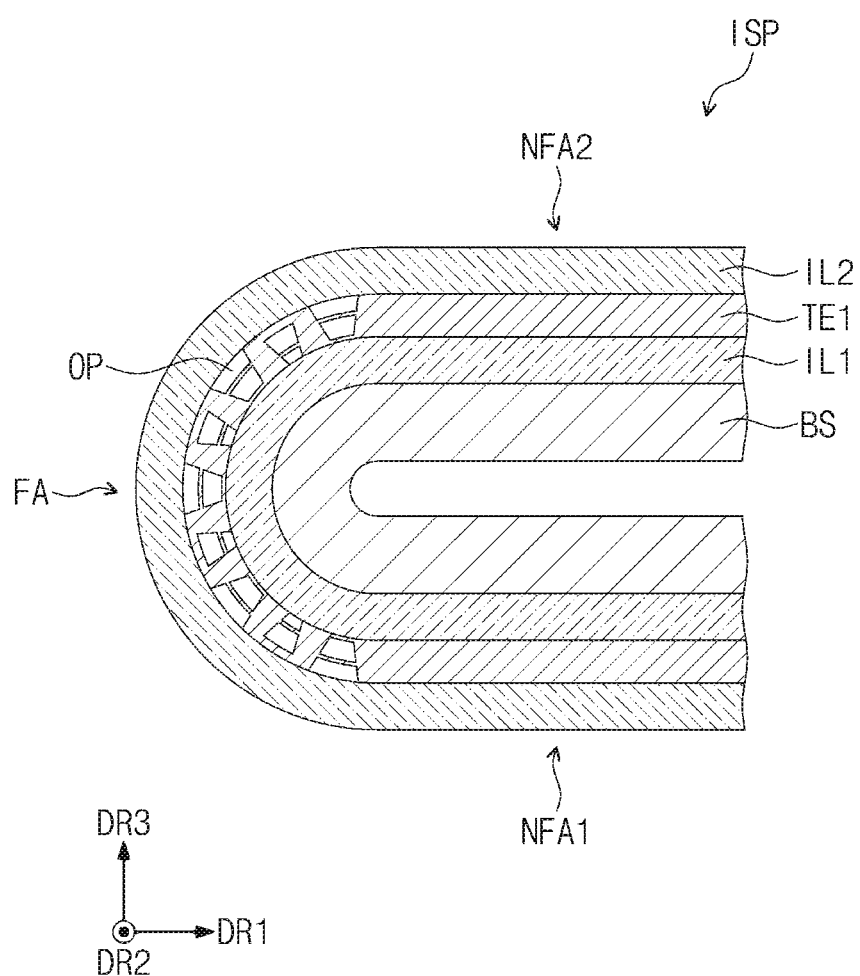
FIG. 21 is a view showing a folded state of the input sensing part shown in FIG. 20.

FIG. 20 is a cross-sectional view taken along the line II-II' shown in FIG. 18, and FIG. 21 is a view showing a folded state of the input sensing part ISP shown in FIG. 20.

In FIG. 20, as an example, the base substrate BS and the first and second insulating layers IL1 and IL2 are shown together with the first electrode TE1, and the second electrode TE2 is omitted.

Referring to FIGS. 20 and 21, when the display device DD is folded, the input sensing part ISP may be folded. As the openings OP overlapping the folding area FA are defined through the first electrode TE1 of the input sensing part ISP, the first electrode TE1 may be more easily folded. Accordingly, the input sensing part ISP may be more easily folded.

Figure 22:
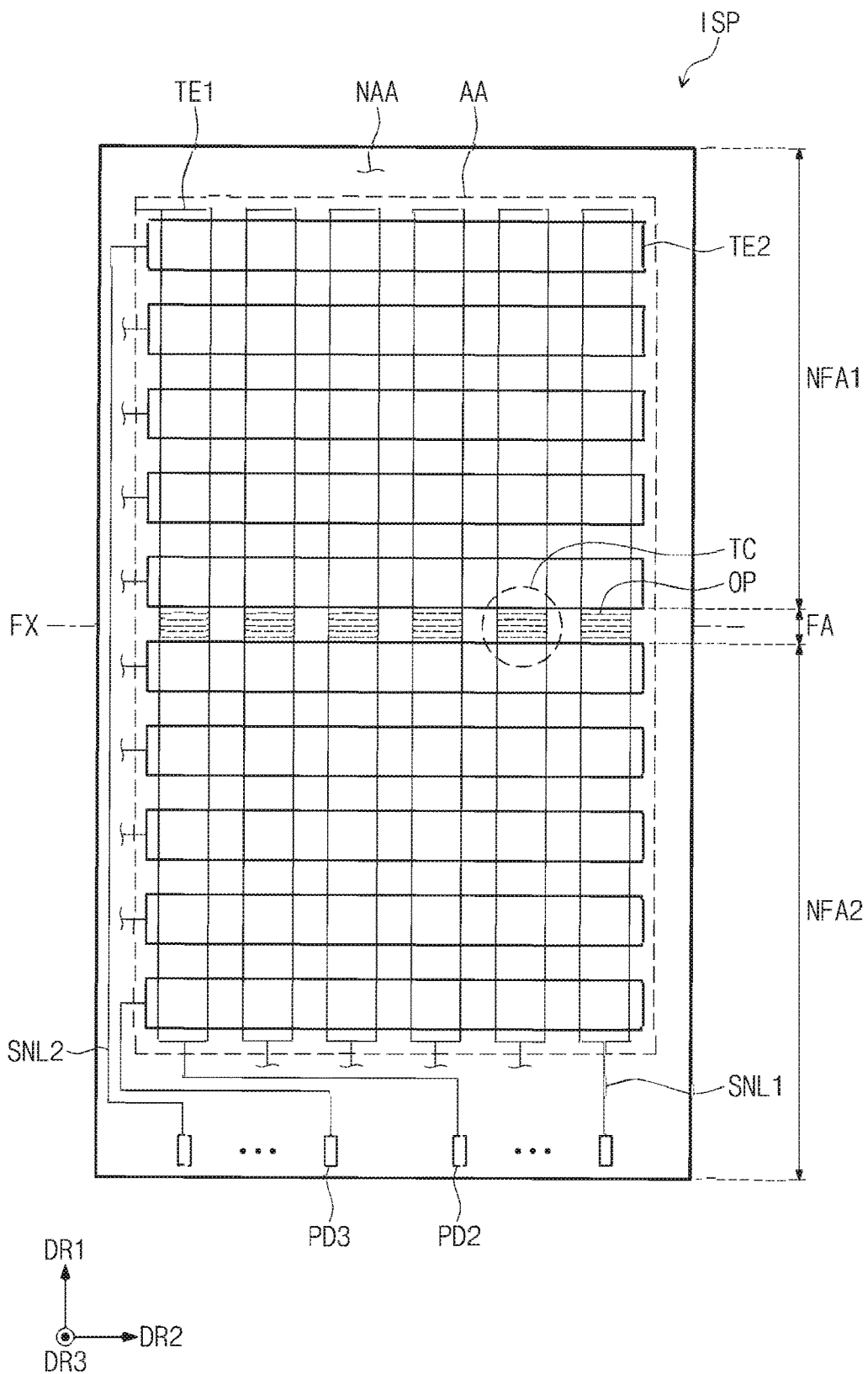
FIG. 22 is a view showing a state in which a folding area is touched in the input sensing part shown in FIG. 11.
Figure 23:
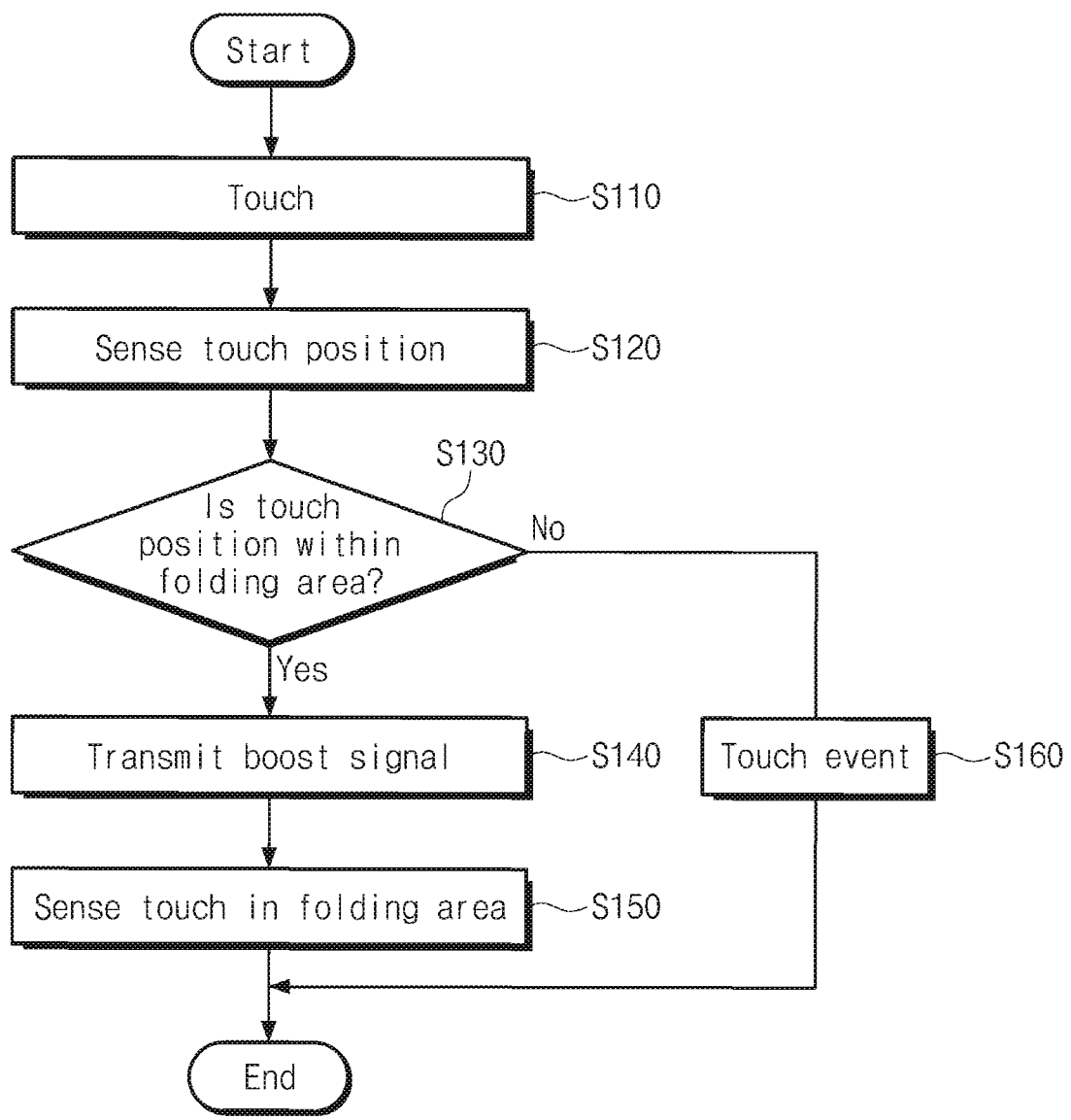
FIG. 23 is a flowchart showing a method of driving a display device according to an embodiment of the present disclosure.

FIG. 22 is a view showing a state in which the folding area is touched in the input sensing part ISP shown in FIG. 11, and FIG. 23 is a flowchart showing a method of driving the display device according to an embodiment of the present disclosure.

Hereinafter, the present embodiment will be described in more detail together with reference to FIG. 15.

Referring to FIGS. 15, 22, and 23, the driving signal TSN may have a first driving voltage and a second driving voltage having a voltage level higher than that of the first driving voltage. The driver TS-IC may apply the first driving voltage to the first electrodes TE1.

In operation S110, the display device DD may be touched. For example, the user may touch the input sensing part ISP. In operation S120, a touch position may be sensed by sensing the touch TC occurring on or at the input sensing part ISP.

In operation S130, it is determined whether the touch position is within the folding area FA. Because the openings OP are defined through the first electrode TE1, the portion of the first electrode TE1 where the openings OP are defined may have high resistance. Accordingly, when the folding area FA is touched, a touch sensitivity may be lowered.

When the touch position is within the folding area FA, a boost signal may be applied to the touched first electrode TE1 in operation S140. In FIG. 22, one first electrode TE1 is touched as a representative example, however, more than one of the first electrodes TE1 may be touched. The boost signal may be the second driving voltage. The driver TS-IC may apply the second driving voltage having the relatively high voltage level to the touched first electrode TE1.

In operation S150, the touch of the folding area FA may be sensed again. Because the second driving voltage having the relatively high voltage level is applied to the first electrode TE1, the touch sensitivity of the folding area FA may be improved.

When the touch position is not within the folding area FA (i.e., the touch position is within the first and second non-folding areas NFA1 and NFA2), a touch event may occur in operation S160. That is, the operation of the display device DD, which corresponds to the touch TC, may be performed.

Figure 24:
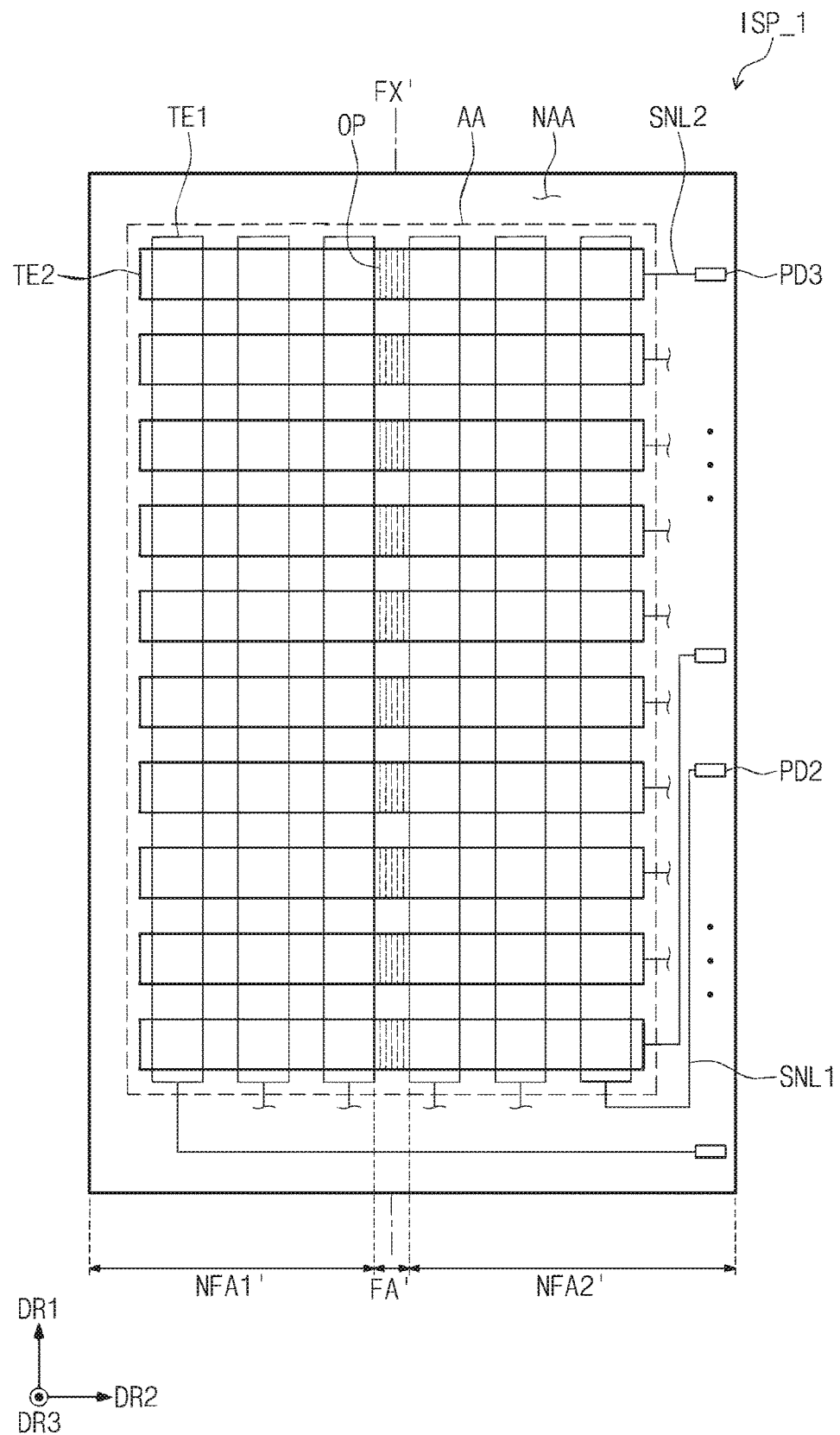
FIG. 24 is a view showing an input sensing part according to another embodiment of the present disclosure.

FIG. 24 is a view showing an input sensing part ISP_1 according to another embodiment of the present disclosure.

As an example, FIG. 24 is a plan view corresponding to that of FIG. 11. Hereinafter, configurations of the input sensing part ISP_1 shown in FIG. 24 will be described in more detail including the configurations different from those of the input sensing part ISP shown in FIG. 11.

Referring to FIG. 24, the input sensing part ISP_1 may include first and second electrodes TE1 and TE2, first and second signal lines SNL1 and SNL2, and second and third pads PD2 and PD3. The second and third pads PD2 and PD3 may be disposed in a non-active area adjacent to a right side or right end of the input sensing part ISP_1 when viewed in a plane or in a plan view. The first and second signal lines SNL1 and SNL2 may be connected to the first and second electrodes TE1 and TE2 and the second and third pads PD2 and PD3.

A first non-folding area NFA1', a folding area FA', and a second non-folding area NFA2' may be arranged in or along the second direction DR2. A folding axis FX' may be substantially parallel to the first direction DR1. The input sensing part ISP_1 may be folded about the folding axis FX'.

Openings OP overlapping the folding area FA' may be defined through the second electrodes TE2. Different from the openings OP shown in FIG. 11, the openings OP may be defined through the second electrodes TE2. Because the openings OP overlapping the folding area FA' are defined through the second electrodes TE2, the second electrodes TE2 may be more easily folded about the folding axis FX'.

Figure 25:
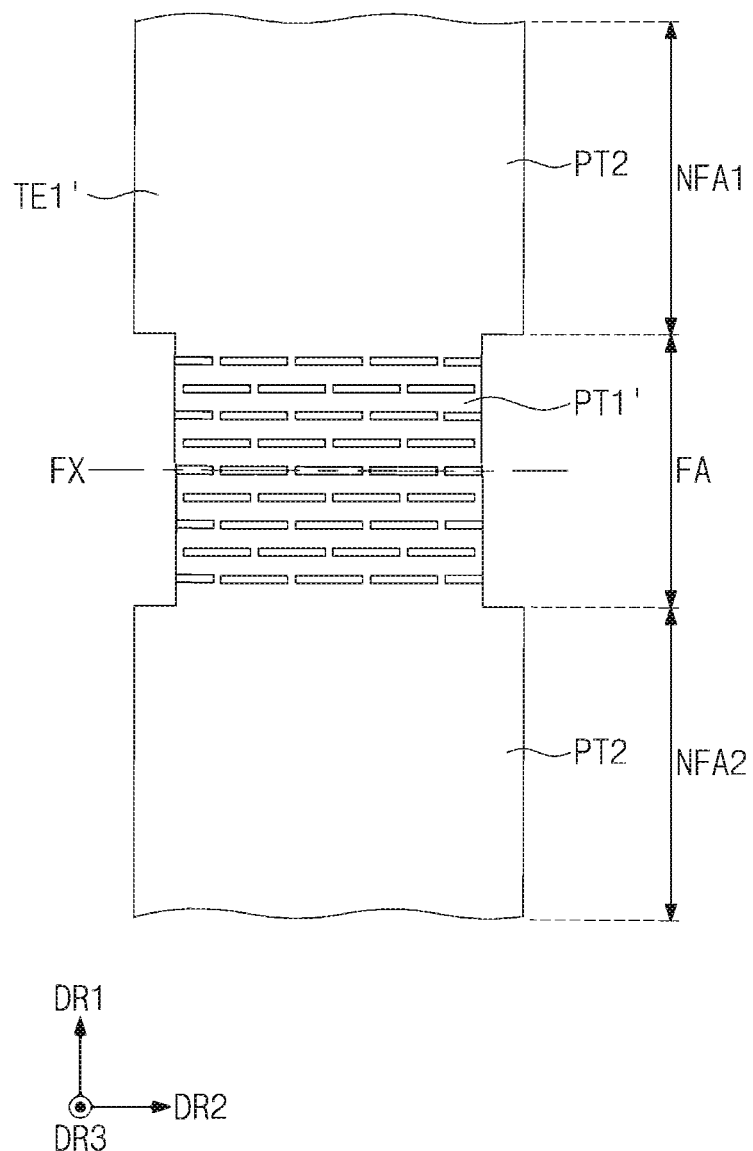
FIG. 25 is a view showing a first electrode of an input sensing part according to another embodiment of the present disclosure.

FIG. 25 is a view showing a first electrode TE1' of an input sensing part according to another embodiment of the present disclosure.

Referring to FIG. 25, the first electrode TE1' may include a first portion PT1' overlapping a folding area FA and a plurality of second portions PT2 overlapping first and second non-folding areas NFA1 and NFA2. The openings OP may be defined through the first portion PT1'. In one or more embodiments, the first portion PT1' may be between adjacent ones of the plurality of second portions PT2.

The first portion PT1' may have a width in the second direction DR2 that is smaller (i.e., less) than a width of each of the second portions PT2 (e.g., adjacent second portions PT2) in the second direction DR2. Because the width of the first portion PT1' decreases, the first portion PT1' may be more easily folded.

Figure 26:
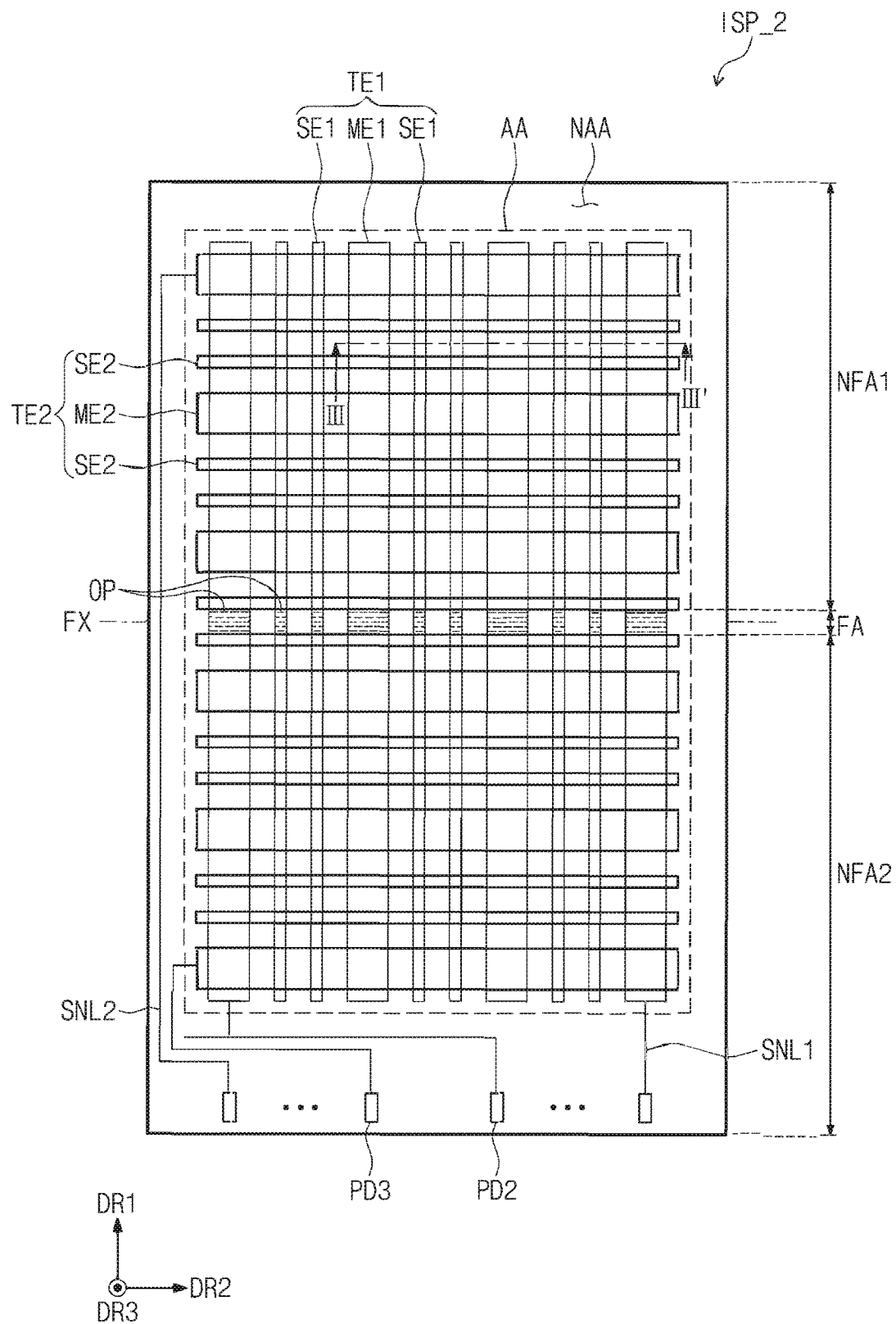
FIG. 26 is a view showing an input sensing part according to another embodiment of the present disclosure.

FIG. 26 is a view showing an input sensing part ISP_2 according to another embodiment of the present disclosure.

As an example, FIG. 26 is a plan view corresponding to that of FIG. 11. Hereinafter, configurations of the input sensing part ISP_2 shown in FIG. 26 will be described in more detail including the configurations different from those of the input sensing part ISP shown in FIG. 11.

Referring to FIG. 26, each of first electrodes TE1 may include a first main electrode ME1 extending in the first direction DR1 and a plurality of first sub-electrodes SE1 extending in the first direction DR1 and adjacent to both sides of the first main electrode ME1 in the second direction DR2. The first main electrode ME1 may be disposed between the first sub-electrodes SE1.

The first main electrode ME1 and the first sub-electrodes SE1 may be connected to second pads PD2 through first signal lines SNL1. Each of the first sub-electrodes SE1 may have a width in the second direction DR2 that is smaller (i.e., less) than a width of the first main electrode ME1 in the second direction DR2. Openings OP may be defined through a portion of the first main electrode ME1 overlapping the folding area FA and portions of the first sub-electrodes SE1 overlapping the folding area FA.

Each of second electrodes TE2 may include a second main electrode ME2 extending in the second direction DR2 and a plurality of second sub-electrodes SE2 extending in the second direction DR2 and adjacent to both sides of the second main electrode ME2 in the first direction DR1. The second main electrode ME2 may be disposed between the second sub-electrodes SE2.

The second main electrode ME2 and the second sub-electrodes SE2 may be connected to third pads PD3 through second signal lines SNL2. Each of the second sub-electrodes SE2 may have a width in the first direction DR1 that is smaller (i.e., less) than a width of the second main electrode ME2 in the first direction DR1.

Figure 27:
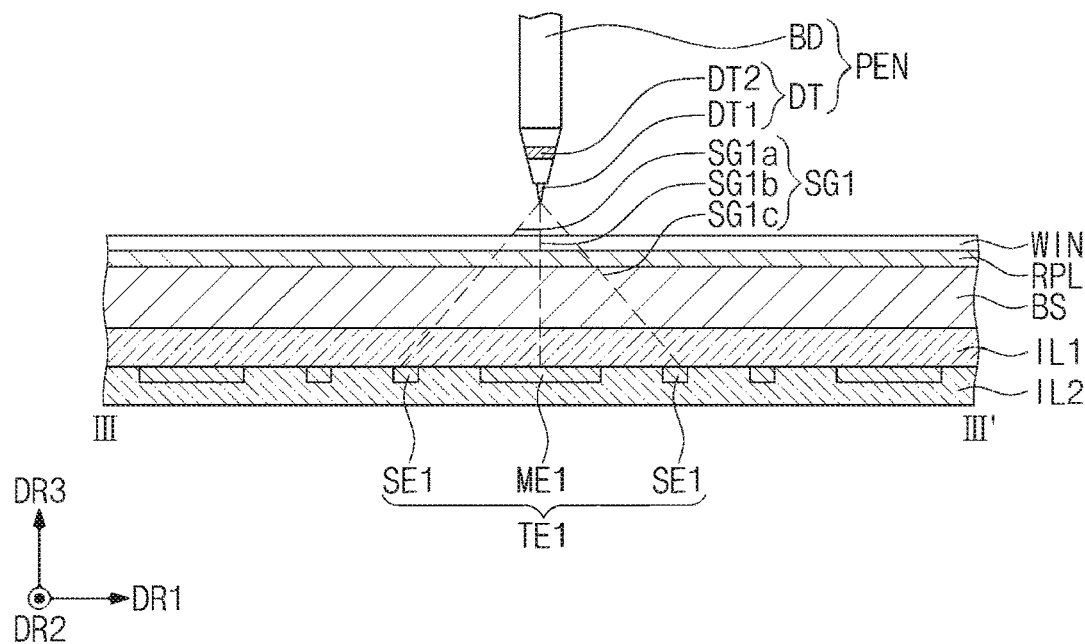
FIG. 27 is a cross-sectional view taken along the line III-III' shown in FIG. 26.
Figure 28:
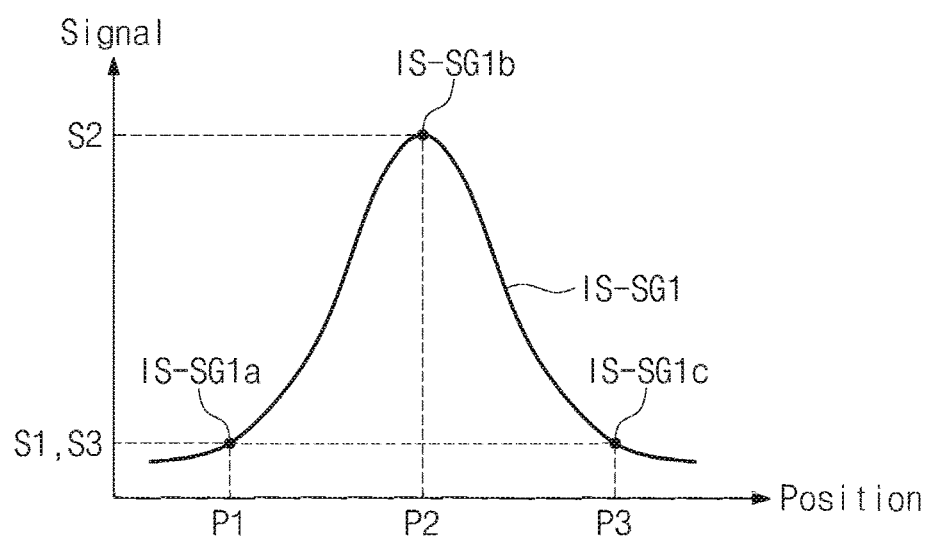
FIG. 28 is a view showing a signal of an input sensing part receiving a first signal according to an embodiment of the present disclosure.

FIG. 27 is a cross-sectional view taken along the line III-III' shown in FIG. 26, and FIG. 28 is a view showing a signal of an input sensing part receiving a first signal according to an embodiment of the present disclosure.

Referring to FIGS. 27 and 28, an anti-reflective layer RPL may be disposed on the input sensing part ISP_2, and a window WIN may be disposed on the anti-reflective layer RPL. An input device PEN may be disposed above the window WIN and may transmit the first signal SG1.

The input device PEN may include a detection portion DT and a body portion BD disposed on the detection portion DT. The detection portion DT may include a first pen electrode DT1 and a second pen electrode DT2 disposed on the first pen electrode DT1. The first pen electrode DT1 may be disposed at an end of the input device PEN. The second pen electrode DT2 may be disposed on a side surface of the body portion BD.

The first pen electrode DT1 may transmit the first signal SG1. The first signal SG1 may have a first frequency. The first frequency may be in a range from about 100 kHz to about 140 kHz. For example, the first frequency may be about 120 kHz. The first signal SG1 may form an electric field radiated with a set width (e.g., a predetermined width). The driver TS-IC may calculate a sensing signal IS-SG1 with the shape of a Gaussian distribution from the first and second electrodes TE1 and TE2 sensing the electric field.

The first signal SG1 may include a first sub-signal SG1$a$, a second sub-signal SG1$b$, and a third sub-signal SG1$c$. The first sub-signal SG1$a$, the second sub-signal SG1$b$, and the third sub-signal SG1$c$ are classified based on an angle at which the first signal SG1 is radiated.

The first main electrode ME1 may sense the second sub-signal SG1$b$. The first sub-electrodes SE1 may respectively sense the first sub-signal SG1$a$ and the third sub-signal SG1$c$.

As the first sub-signal SG1$a$ is sensed, the driver TS-IC may calculate a first sensing signal IS-SG1$a$ having a first intensity S1 with respect to a position P1 of one of the first sub-electrodes SE1. As the second sub-signal SG1*b* is sensed, the driver TS-IC may calculate a second sensing signal IS-SG1*b* having a second intensity S2 with respect to a position P2 of the first main electrode ME1. As the third sub-signal SG1*c* is sensed, the driver TS-IC may calculate a third sensing signal IS-SG1*c* having a third intensity S3 with respect to the other position P3 of the first sub-electrodes SE1.

The driver TS-IC may combine the first sensing signal IS-SG1*a*, the second sensing signal IS-SG1*b*, and the third sensing signal IS-SG1*c* to calculate the sensing signal IS-SG1. The driver TS-IC may calculate an accurate coordinate of the position at which the input device PEN is disposed in response to the sensing signal IS-SG1. When the coordinate is more accurately sensed using the first main electrode ME1 and the first sub-electrodes SE1 adjacent to the first main electrode ME1, a linearity of an input provided in the form of a line may be improved.

Figure 29:
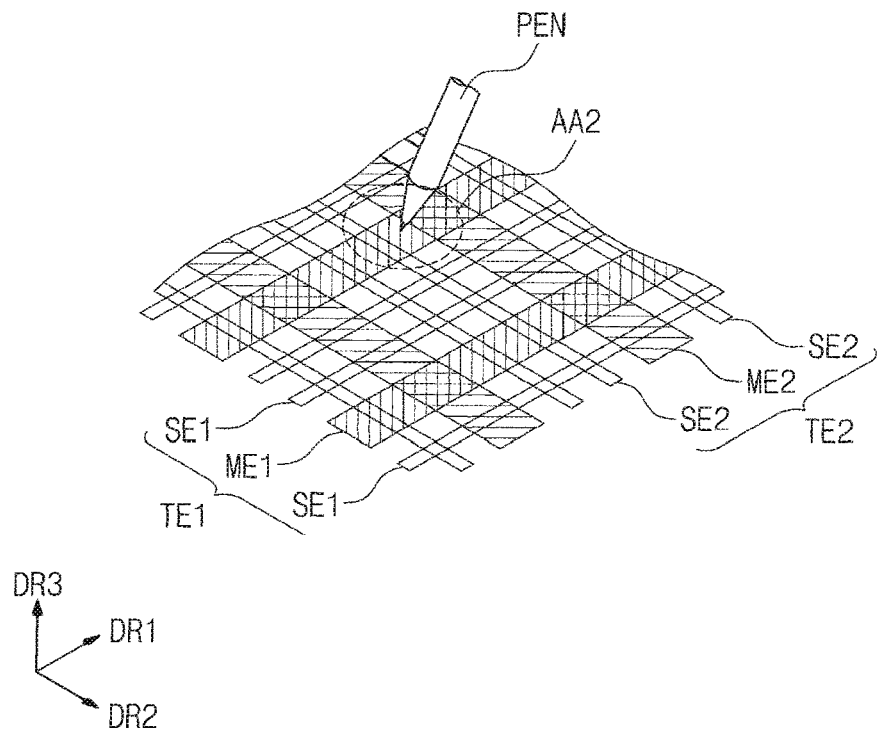
FIG. 29 is a perspective view showing an input device disposed on the input sensing part shown in FIG. 26.
Figure 30:
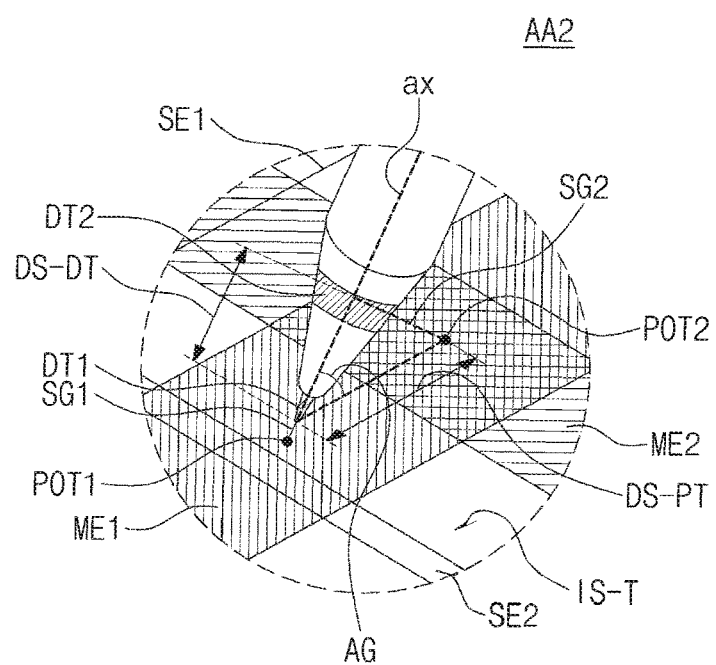
FIG. 30 is an enlarged view showing a second area shown in FIG. 29.

FIG. 29 is a perspective view showing the input device PEN disposed on the input sensing part shown in FIG. 26, and FIG. 30 is an enlarged view showing a second area AA2 shown in FIG. 29.

Referring to FIGS. 29 and 30, the second pen electrode DT2 may transmit the second signal SG2 in a direction vertical to a center axis ax of the input device PEN. The second signal SG2 may form an electric field. The second signal SG2 may have a second frequency different from the first frequency of the first signal SG1. The second frequency may be in a range from about 210 kHz to about 250 kHz. For example, the second frequency may be about 230 kHz.

When the first electrodes TE1 and the second electrodes TE2 sense the first signal SG1, the driver TS-IC may calculate a first coordinate POT1. When the first electrodes TE1 and the second electrodes TE2 sense the second signal SG2, the driver TS-IC may calculate the second coordinate POT2. The driver TS-IC may calculate a distance DS-PT between the first coordinate POT1 and the second coordinate POT2.

The driver TS-IC may calculate an angle AG of the input device PEN with respect to an upper surface IS-T of the input sensing part ISP_2 using a right-angled triangular shape having a distance DS-DT between the first pen electrode DT1 and the second pen electrode DT2 and a distance DS-PT between the first coordinate POT1 and the second coordinate POT2. The input device PEN may sufficiently approach the input sensing part ISP_2, and a distance between the first pen electrode DT1 and the upper surface IS-T may be negligible.

The first and second sub-electrodes SE1 and SE2 may sense the second signal SG2. The driver TS-IC may correct the second coordinate POT2 required to calculate the angle AG of the input device PEN with respect to the upper surface IS-T using the signal sensed by the first and second sub-electrodes SE1 and SE2. Accordingly, the coordinate accuracy of the display device DD with respect to the second signal SG2 of the input device PEN may be improved. As a result, the sensing reliability of the display device DD may be improved.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims, and equivalents thereof.

What is claimed is:

1. A display device comprising:
    a display panel comprising non-folding areas arranged along a first direction and a folding area between the non-folding areas;
    a first electrode on the display panel and extending in the first direction; and
    a second electrode on the display panel, insulated from the first electrode, and extending in a second direction crossing the first direction,
    wherein openings overlapping the folding area are in the first electrode, and
    wherein the openings are arranged along a third direction substantially perpendicular to a plane defined by the first and second directions, and the third direction is defined as a thickness direction with respect to the first electrode.

2. The display device of claim 1, wherein the openings extend in the second direction, the openings being arranged along the first direction and the second direction.

3. The display device of claim 1, wherein the openings comprise:
    first horizontal openings arranged along the second direction; and
    second horizontal openings arranged along the second direction, the second horizontal openings being spaced from the first horizontal openings in the first direction.

4. The display device of claim 3, wherein the first horizontal openings partially overlap the second horizontal openings in the first direction.

5. The display device of claim 3, wherein the first horizontal openings are alternately arranged with the second horizontal openings.

6. The display device of claim 1, wherein the openings extend in the third direction, the openings being arranged along the first direction and the third direction.

7. The display device of claim 6, wherein the openings comprise:
    first vertical openings arranged along the third direction; and
    second vertical openings arranged along the third direction, the second vertical openings being spaced from the first vertical openings in the first direction.

8. The display device of claim 7, wherein the first vertical openings partially overlap the second vertical openings in the first direction.

9. The display device of claim 7, wherein the first vertical openings are alternately arranged with the second vertical openings.

10. The display device of claim 1, further comprising a driver configured to provide a first driving voltage to the first electrode,
    wherein the first electrode comprises a plurality of first electrodes,
    wherein the second electrode comprises a plurality of second electrodes, and
    wherein the driver is configured to apply a second driving voltage having a voltage level higher than a voltage level of the first driving voltage to a touched first electrode from among the first electrodes when the folding area is touched.

11. The display device of claim 1, further comprising:
    a base substrate on the display panel; and
    an adhesive layer under the base substrate, wherein the first and second electrodes are under the base substrate, the first and second electrodes being attached to the display panel by the adhesive layer.

12. The display device of claim 1, wherein the first electrode comprises:
a first portion having the openings, the first portion overlapping the folding area in a plan view; and
a plurality of second portions overlapping the non-folding areas in a plan view, and
wherein the folding area and the first portion are configured to be folded about a folding axis substantially parallel to the second direction.

13. The display device of claim 12, wherein a width of the first portion in the second direction is less than a width of each of the second portions in the second direction.

14. The display device of claim 1, wherein the first electrode comprises:
a first main electrode extending in the first direction; and
a plurality of first sub-electrodes extending in the first direction, a width of each of the first sub-electrodes in the second direction being less than a width of the first main electrode in the second direction,
wherein the first main electrode is between the first sub-electrodes, and
wherein the openings are in the first main electrode and the first sub-electrodes.

15. The display device of claim 1, wherein the second electrode comprises:
a second main electrode extending in the second direction; and
a plurality of second sub-electrodes extending in the second direction, a width of each of the second sub-electrodes being less in the first direction than a width of the second main electrode in the first direction, and
wherein the second main electrode is between the second sub-electrodes.

16. A method of driving a display device, comprising:
touching an input sensing part on a display panel comprising a folding area, the input sensing part comprising:
a plurality of first electrodes having openings overlapping the folding area, the first electrodes being configured to receive a first driving voltage; and
a plurality of second electrodes insulated from the first electrodes, the second electrodes crossing the first electrodes;
sensing a position of the touch;
applying a second driving voltage having a voltage level higher than the first driving voltage to a first electrode that is touched from among the first electrodes when the touch position is within the folding area; and
sensing the touch on the folding area.

17. The method of claim 16, wherein the first electrodes extend in a first direction,
wherein the second electrodes extend in a second direction crossing the first direction,
wherein the folding area is configured to be folded about a folding axis substantially parallel to the second direction, and
wherein the openings extend in the second direction and are arranged along the first direction and the second direction.

18. The method of claim 17, wherein the openings comprise:
first horizontal openings arranged along the second direction; and
second horizontal openings arranged along the second direction, the second horizontal openings being spaced from the first horizontal openings in the first direction, and
wherein the first horizontal openings are alternately arranged with the second horizontal openings.

19. The method of claim 17, wherein the openings further extend in a third direction substantially perpendicular to a plane defined by the first and second directions, the openings being arranged along the first direction and the third direction, the openings comprising:
first vertical openings arranged along the third direction; and
second vertical openings arranged along the third direction, the second vertical openings being spaced from the first vertical openings in the first direction, and
wherein the first vertical openings are alternately arranged with the second vertical openings.

* * * * *